(12) United States Patent
Niinistö et al.

(10) Patent No.: US 7,498,272 B2
(45) Date of Patent: *Mar. 3, 2009

(54) METHOD OF DEPOSITING RARE EARTH OXIDE THIN FILMS

(75) Inventors: Jaakko Niinistö, Helsinki (FI); Matti Putkonen, Helsinki (FI); Mikko Ritala, Espoo (FI); Petri Räisänen, Berkeley Heights, NJ (US); Antti Niskanen, Helsinki (FI); Markku Leskelä, Espoo (FI)

(73) Assignee: ASM International N.V., Bilthoven (NL)

( * ) Notice: Subject to any disclaimer, the term of this patent is extended or adjusted under 35 U.S.C. 154(b) by 653 days.

This patent is subject to a terminal disclaimer.

(21) Appl. No.: 11/024,515

(22) Filed: Dec. 28, 2004

(65) Prior Publication Data

US 2009/0035949 A1    Feb. 5, 2009

Related U.S. Application Data

(63) Continuation of application No. 10/067,634, filed on Feb. 4, 2002, now Pat. No. 6,858,546.

(30) Foreign Application Priority Data

Aug. 3, 2001    (JP)    ............... 2001/236874

(51) Int. Cl.
  *H01L 21/44*    (2006.01)
(52) U.S. Cl. ............... 438/785; 438/681; 257/E21.24
(58) Field of Classification Search ............... 438/680, 438/681, 785; 427/255.28
See application file for complete search history.

(56) References Cited

U.S. PATENT DOCUMENTS

| | | | |
|---|---|---|---|
| 4,058,430 A | 11/1977 | Suntola et al. | |
| 5,711,811 A | 1/1998 | Suntola et al. | |
| 6,548,424 B2 * | 4/2003 | Putkonen | 438/785 |
| 6,858,546 B2 * | 2/2005 | Niinistö et al. | 438/785 |
| 6,984,591 B1 * | 1/2006 | Buchanan et al. | 438/778 |

OTHER PUBLICATIONS

Hong et al., "Epitaxial cubic gadolinium oxide as a dielectric for gallium arsenide passivation," *Science*, 1999, pp. 1897-1900, vol. 283.

Mölsä et al., "Growth of yttrium oxide thin films from β-Dikelonate precursor," *Adv. Materials for Optics and Electronics*, 1994, pp. 389-400, vol. 4.

Putkonen et al., "Low-temperature ALE deposition $Y_2O_3$ thin films from βDikelonate precursors," *Chem. Vap. Deposition*, 2001, pp. 44-50, vol. 7.

(Continued)

*Primary Examiner*—Alexander G Ghyka
(74) *Attorney, Agent, or Firm*—Knobbe, Martens, Olson & Bear LLP

(57) ABSTRACT

The present invention concerns a process for depositing rare earth oxide thin films, especially yttrium, lanthanum and gadolinium oxide thin films by an ALD process, according to which invention the source chemicals are cyclopentadienyl compounds or rare earth metals, especially those of yttrium, lanthanum and gadolinium. Suitable deposition temperatures for yttrium oxide are between 200 and 400° C. when the deposition pressure is between 1 and 50 mbar. Most suitable deposition temperatures for lanthanum oxide are between 160 and 165° C. when the deposition pressure is between 1 and 50 mbar.

24 Claims, 22 Drawing Sheets

OTHER PUBLICATIONS

Seim et al., "Deposition of LaNiO$_3$ thin films in an atomic layer epitaxy reactor," *J. Mater. Chem.,* 1997, pp. 449-454, vol. 7.

Seim et al., "Growth of LaCoO$_3$ thin films from β-Dikelonate precursors," *Appl. Surf. Science*, 1997, pp. 243-250, vol. 112.

\* cited by examiner

METHOD OF DEPOSITING RARE EARTH OXIDE THIN FILMS

REFERENCE TO RELATED APPLICATIONS

The present application is a continuation of U.S. patent application Ser. No. 10/067,634, filed Feb. 4, 2002 now U.S. Pat. No. 6,858,546 and claims priority to Japanese Patent Application Number 2001-236874, filed Aug. 3, 2001.

BACKGROUND OF THE INVENTION

1. Field of the Invention

The present invention relates to a method of depositing rare earth oxide thin films. In particular, the invention concerns a method of growing yttrium, gadolinium and lanthanum oxide thin films by Atomic Layer Deposition (referred to as ALD hereinafter).

ALD has previously been known as Atomic Layer Epitaxy (ALE) and later more specifically as Atomic Layer Chemical Vapor Deposition (Atomic Layer CVD™ and ALCVD™) process which are trademarks of ASMI®. ALD has been adopted as a general name of the method to avoid possible confusion when discussing about polycrystalline and amorphous thin films. Other names used in the literature for ALD are digital epitaxy, digital layer epitaxy (DLE), atomic layer growth, atomic layer processing, deposition layer by layer, sequential CVD, cycle CVD, cyclic CVD and pulsed CVD. The ALD method is based on sequential self-saturated surface reactions.

2. Description of the Related Art

According to N. N. Greenwood et al. (Chemistry of the Elements, $1^{st}$ edition, Pergamon Press Ltd., U.K., 1986, page 1423) "rare-earth elements" comprise Sc, Y, La and lanthanide series from Ce to Lu. These elements belong to metals. Oxides of rare earth elements are called rare earth oxides, $REO_x$. A general symbol Ln is often used in the literature to refer to the fourteen lanthanide elements cerium to lutetium inclusive. Sometimes lanthanides are also called as "lanthanons" or "lanthanoids". $REO_x$ thin films have potential applications in compound semiconductor and/or silicon based microelectronics. Compound semiconductors have several advantages compared to silicon. Especially, electron mobility is remarkably higher in compound semiconductors than in silicon. Therefore, it is possible to produce faster components from compound semiconductors. Furthermore, compound semiconductors are efficient light emitters enabling easy integration to light emitting components.

One remarkable problem related to compound semiconductors is lack of passivating and dielectric native oxide (compare $SiO_2$ on silicon). So far, no other oxide has worked successfully in compound semiconductor MOSFETs (metal-oxide-semiconductor filed effect transistors) resulting in low space densities on semiconductor-insulator interface. In 1999 M. Hong et al. (Science 283 (1999) 1897) showed that the requirements for MOSFET insulator could be fulfilled by growing an epitaxial layer of $Gd_2O_3$ on GaAs surface. At the same time, it was disclosed that other rare earth oxides would work similarly.

In silicon based integrated circuits, $REO_x$ is a potential material to replace $SiO_2$ as the gate oxide in MOSFETs. To reach the required capacitance, the thickness of $SiO_2$ should be reduced to a level where the tunneling of fuel charge through the insulator becomes evident. Therefore, to avoid the problem, $SiO_2$ must be replaced with material that has higher dielectric constant than $SiO_2$, is thermally stable in contact with silicon and which can be formed On silicon in a controlled manner. $SiO_2$ layer or electrically active defects must not be formed at the interface between silicon and the insulator and the thickness of the dielectric layer should be carefully controlled.

$SiO_2$ may be formed to an interface between silicon and the dielectric because of interaction between silicon and the dielectric or because of oxidation that takes place during depositing the dielectric layer or during a high-temperature anneal. Favorably, the deposition process of the dielectric is carried out at low temperature, where the formation of $SiO_2$ is kinetically hindered.

$REO_x$ are thermodynamically stable when contacted with silicon oxide. Therefore, $REO_x$ are suitable dielectrics on silicon.

Yttrium oxide and lanthanum oxide are interesting thin film materials especially in the point of view of the semiconductor industry. $Y_2O_3$ thin films have been produced by many different processes, whereas considerably less research has been focused on $La_2O_3$. The production of $Y_2O_3$ and $La_2O_3$ thin films by different methods and their applications are surveyed in the literature. The production methods of the thin films are roughly divided into physical and chemical processes including both gas phase and liquid phase methods. Because of the physical properties of $Y_2O_3$ such as the crystallographic stability up to 2330° C., high mechanical strength, high dielectric constant and the value of the refractive index, $Y_2O_3$ thin films have many potential applications (Gabordiaud, R. J. et al., Appl. Phys. A 71 (2000) 675-680). Especially interesting feature, from point of view of electronic applications, is quite good compatibility of the lattice constant of $Y_2O_3$ with silicon: $a(Y_2O_3)$=10.60 Å and $a(Si)$ 2=10.86 Å (Cho M.-H. et al., J. Appl. Phys. 85 (1999) 2909-291).

Perhaps the most important application of $Y_2O_3$ thin films is to use them in transistors as an alternative gate oxide material having a high dielectric constant. The significance and use of an alternative gate oxide material is described in more detail later. Another application for the dielectric thin film in silicon technology is capacitor dielectric in DRAM-memories (dynamic random-access memory) (Kingon et al, Nature 406 (2000) 1032-1038).

$Y_2O_3$ thin films have been used as buffer layers for example for ferroelectrics and new high temperature superconductors. $Y_2O_3$ is also an important material in optical applications. For example, $Y_2O_3$ thin films have been used as dielectric layer in electroluminescent displays. $Y_2O_3$ matrix activated with europium has red luminescence and can be used, e.g., in fluorescent lamps and CRT tubes. $Y_2O_3$ has proved to be useful as a protective coating.

Despite the interesting properties of $La_2O_3$, possible applications of the $La_2O_3$ thin films have been studied rather little for the time being. $La_2O_3$ thin films have been used as optical and protective coatings. $La_2O_3$ coatings have been used also in gas sensor and catalytic applications. However, because of the high dielectric constant and compatibility with silicon, $La_2O_3$ is a possible gate oxide material in the future. Promising results have been recently reported by replacing $SiO_2$ with $La_2O_3$ as a gate oxide.

Continuous decrease of the size of the electronic components has set severe restrictions on the performance of the $SiO_2$ gate oxide. Thickness of the gate oxide approaches the quantum tunneling junction of 10 Å for $SiO_2$. An alternative solution is to find a new dielectric material having a dielectric constant κ essentially higher than 3.9 for $SiO_2$. The substituting alternative dielectric material has to be thermally stable at temperatures even over 1000 K, due to high-temperature anneals required in modern silicon processes. Equivalent thickness of SiO$_2$ t$_{eq}$ has to be below 15 Å. Equivalent thickness of SiO$_2$ is defined with an equation:

$$t_{eq} = t_{ox}\left(\frac{\kappa_{SiO_2}}{\kappa_{ox}}\right) \quad (1)$$

wherein t$_{ox}$ is the actual thickness of the alternative dielectric material, $\kappa_{SiO_2}$ is the dielectric constant 3.9 of SiO$_2$ and $\kappa_{ox}$ is the dielectric constant of the alternative dielectric material.

The principle and applications of atomic layer deposition (ALD) are described extensively below. Since the deposition temperature is considerably high in most thin film deposition methods, ALD opens new possibilities to use low deposition temperature. According to literature, the Y$_2$O$_3$ thin films have been deposited for time being only by using Y(thd)$_3$ or derivatives thereof as the ALD source material.

In the atomic layer deposition method the principle is to feed source materials by alternately pulsing them into the reactor space. During each source material pulse excess source material is present in the gas phase of the reaction space in order to saturate the substrate surface. The excess of the source material that is physi-sorbed on a surface or which is in a gas phase inside the reactor is purged away with an inert gas flow during the time interval between different source chemical pulses. In an ideal case only one atom layer or a specific fraction thereof is chemisorbed onto the substrate. Another source material pulsed subsequently reacts with the chemisorbed layer. The growth of film is controlled by the surface reactions, so the duration of the source material pulses does not need to be controlled as precisely as in other CVD methods.

In an ideal case, a single atomic or molecular layer is grown during one source material pulse, but in practice the growth rate remains considerably lower. Reason to this is most commonly steric hindrances due to the size of the source material molecules.

An ALD type process is controlled by surface reactions, which can often be controlled by process temperatures and gas flowing rates. An appropriate temperature range is called ALD (or ALE) window. Parameters preventing the ALD growth outside the ALD window are shown in FIG. 1 (Niinistö et al., Proc. Int. Semicond. Conf. (2000) 33-42).

Mölsä et al. (Adv. Mater. Opt. Electron. 4 (1994) 389-400) have grown Y$_2$O$_3$ thin films in a flow-type ALD reactor using Y(thd)$_3$ and oxygen or ozone as the source materials. The aim of the study was to produce a Y$_2$O$_3$ buffer layer for high temperature superconductor films. The effect of the substrate material, pressure and pulsing time on the properties of the thin film was examined. The tested growth temperature range was from 425 to 600° C., which is too high for many applications. The growth rate was determined to be about 0.8 Å/cycle, but the growth rate was observed to increase with the increasing temperature. This indicates the lack of so called ALD window, which was the basic starting point for further studies of Putkonen et al. (Chem. Vap. Deposition 7 (2001) 44-50).

Putkonen et al. studied the ALD deposition of the Y$_2$O$_3$ thin films in the temperature range of 200-425° C. by using Y(thd)$_3$-, Y(thd)$_3$(bipyridyl)- or Y(thd)$_3$(1,10-fenantroline) compounds as the metal source and ozone as the oxygen source. A constant growth rate of 0.22-0.23 Å/cycle was observed in the temperature range of 250-350° C. for all source materials. The ALD window representing the observed controlled growth is shown in FIG. 2. This temperature range is considerably lower than temperatures used previously in CVD depositions of the Y$_2$O$_3$ thin films. However, the growth rate remained impractically low. Also the hydrogen and carbon impurity levels were rather high. FIG. 2 depicts carbon and hydrogen content as a function of the deposition temperature.

Crystallinity and orientation of the films depended on the deposition temperature. Crystallinity increased strongly as the deposition temperature was elevated over 375° C. The films grown onto Si(100) and soda lime glass substrates at the deposition temperature of 350° C. were polycrystalline with (400) and (440) reflections being dominant (FIG. 3).

Despite the application possibilities of La$_2$O$_3$, only few articles have been published in literature on the deposition of the La$_2$O$_3$ thin films. Electron spray evaporation, different thermal vaporizing processes, pulsating laser deposition and atom spray deposition amongst physical methods have been used. Only pyrolysis, CVD, and ALD (Seim H. et al., Appl. Surf. Sci. 112 (1997) 243-250, Seim H. et al., J. Mater, Chem. 7 (1997) 449-454 and Nieminen M. et al. Appl. Surf. Sci., in press) present the chemical deposition methods.

Nieminen et al. studied ALD deposition of La$_2$O$_3$ using La(thd)$_3$ as a lanthanum source in order to find an ALD window. A temperature range from 180 to 425° C. was examined. Si(100) and soda lime glass were used as substrates. The growth rate of the films as a function of temperature is shown in FIG. 4. The pulsing time for La(thd)$_3$ was 0.8 and for ozone 2 s. A constant growth rate of 0.36 Å/cycle was detected for the temperature range from 225 to 275° C. Therefore a self-controlling deposition process typical to ALD was observed at this temperature range. X-ray diffraction (XRD) measurements on films showed to be comparable with the data presented by Seim et al. Stoichiometry and carbon content of the films were determined by TOF-ERDA (Time-of-Flight Elastic Recoil Detection Analysis) and RBS (Rutherford Backscattering Spectrometry). The carbon content depended on the deposition temperature (FIG. 4). However, in the range of the self controlled growth the elemental contents correspond to those of La$_2$O$_2$CO$_3$, indicating very poor quality of the resulted film because of the carbonate incorporation. Bending vibrations were observed in the IR-measurements of films grown over 350° C. because of the hydroxyl groups present in the film.

SUMMARY OF THE INVENTION

It is an object of the present invention to eliminate the problems of the prior art and to provide a novel method of depositing rare earth oxide thin films by an ALD type process.

It is another object of the invention to provide a new process for depositing yttrium, gadolinium and lanthanum oxide thin films.

These and other objectives, together with the advantages thereof over known processes, which shall become apparent from the following specification, are accomplished by the invention as hereinafter described and claimed.

The invention is based on the surprising finding that organometallic cyclopentadienyl compounds of rare earth elements together with water or mixtures of oxygen and ozone are successfully used as ALD source chemicals when depositing rare. earth oxides. According to an embodiment of the present invention, the reaction between the gaseous cyclopentadienyl compound of yttrium or lanthanum and water vapor or a mixture of oxygen and ozone gives rise to a controlled growth of high quality yttrium oxide or lanthanum oxide thin films. Although the present invention is mostly focused on cyclopentadienyl compounds, it should be noted that cyclooctadienyl compounds are also volatile and useful as ALD source chemicals for the deposition of rare earth oxides.

According to a preferred embodiment of the invention, the rare earth metal oxide thin films are grown by an ALD type process using vaporized cyclopentadienyl compounds of the rare earth metal or derivatives thereof and a reactive oxygen source as precursors. Preferably the reactive oxygen source is water vapor and/or a mixture of oxygen and ozone.

According to one preferred embodiment of the invention, the yttrium, lanthanum or gadolinium oxide thin films are grown by an ALD type process using vaporized cyclopentadienyl compounds of La, Y or Gd and water vapor and/or mixture of oxygen and ozone as precursors.

According to another embodiment of the present invention hydrogen peroxide, mixture of hydrogen peroxide or oxygen plasma is used as oxygen source material.

A number of considerable advantages are achieved with the aid of the present invention. Thus, considerably high growth rate of rare earth oxide thin films, for instance yttrium and lanthanum oxide thin films, are achieved at relatively low deposition temperature. Very cheap and safe source of oxygen, namely water, can be applied. The use of yttrium and lanthanum source chemicals of the present invention results in a growth rate of even five times faster compared to conventionally used thd compounds. Furthermore, the stoichiometry, morphology and crystallinity of the films deposited according to the present invention are better compared to films grown from the compounds. Generally it can be said, that smoothness of the $Y_2O_3$ thin films grown with new source materials is fully comparable with the smoothness of the films grown with $Y(thd)_3$.

DETAILED DESCRIPTION OF THE PREFERRED EMBODIMENT

Figure 1:
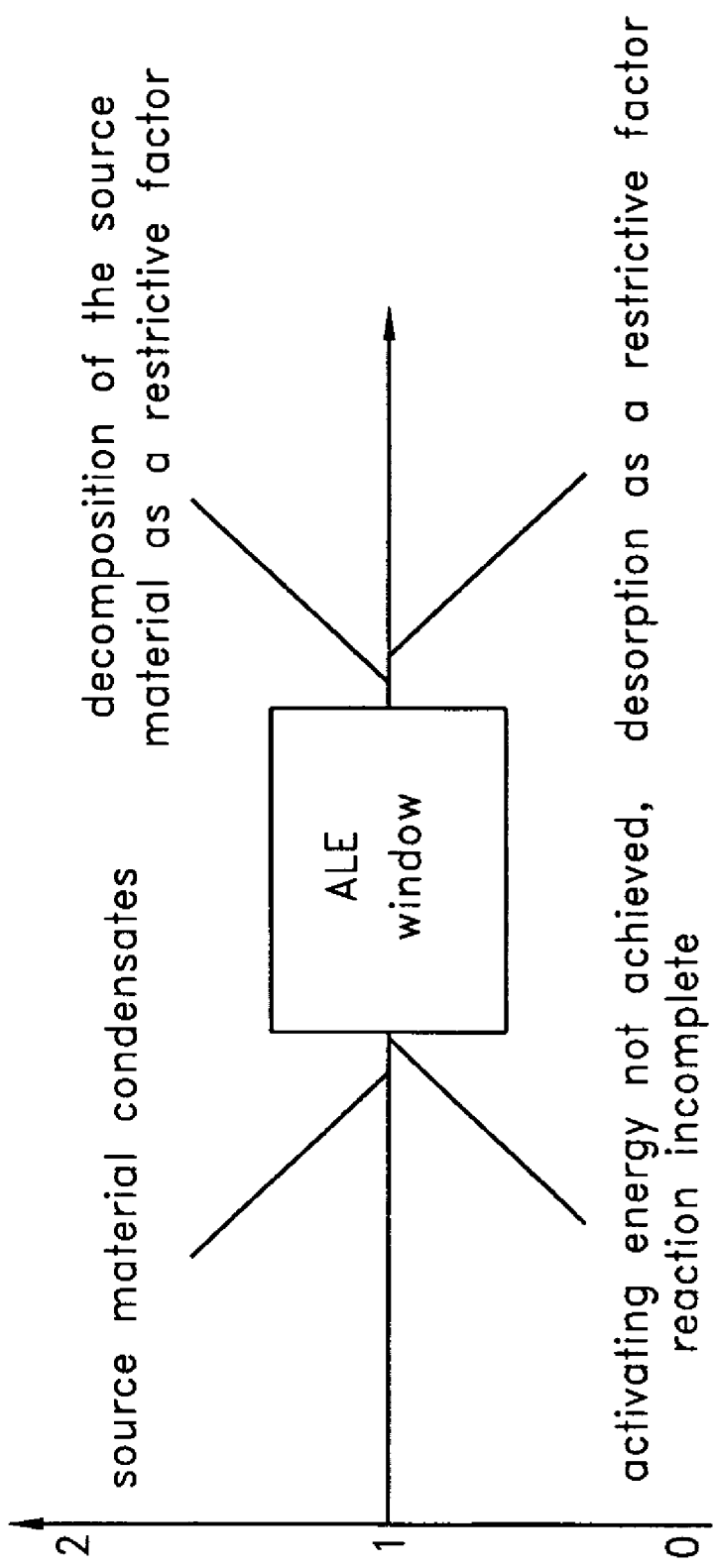
FIG. 1 shows the concept of the ALD (ALE) window.
Figure 2:
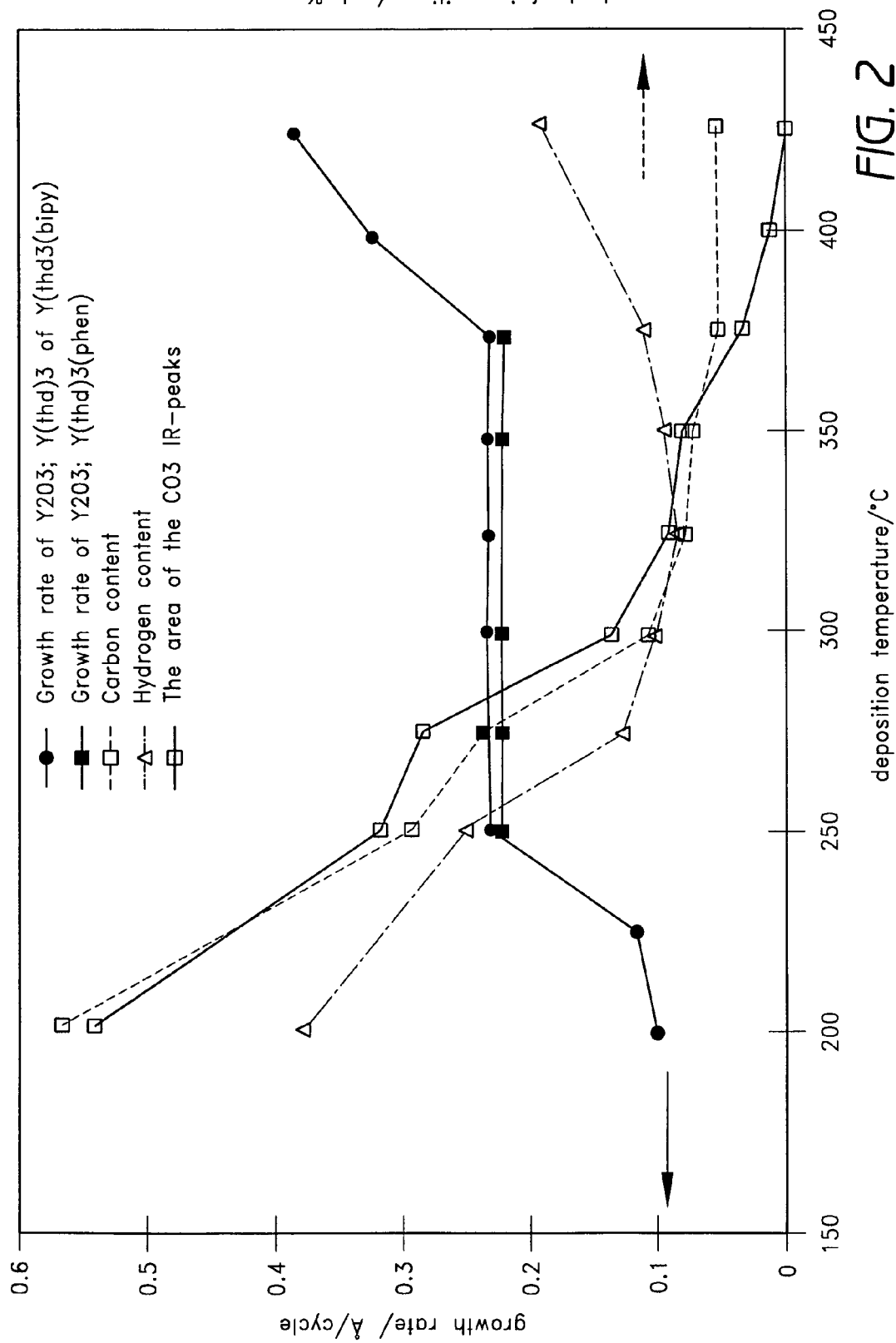
FIG. 2 shows the growth rate of $Y_2O_3$ thin films for different thd type source materials as a function of the deposition temperature. In addition, data for impurity analyses in different temperatures for carbon, hydrogen and $CO_3$ is presented (Putkonen et al.). The vertical axis of the left shows a growth rate [Å/cycle], the vertical axis on the right shows the content of impurities [at –%] and the relative area of the CO3 IR-peaks, and the horizontal axis shows the deposition temperature [° C.].
Figure 3:
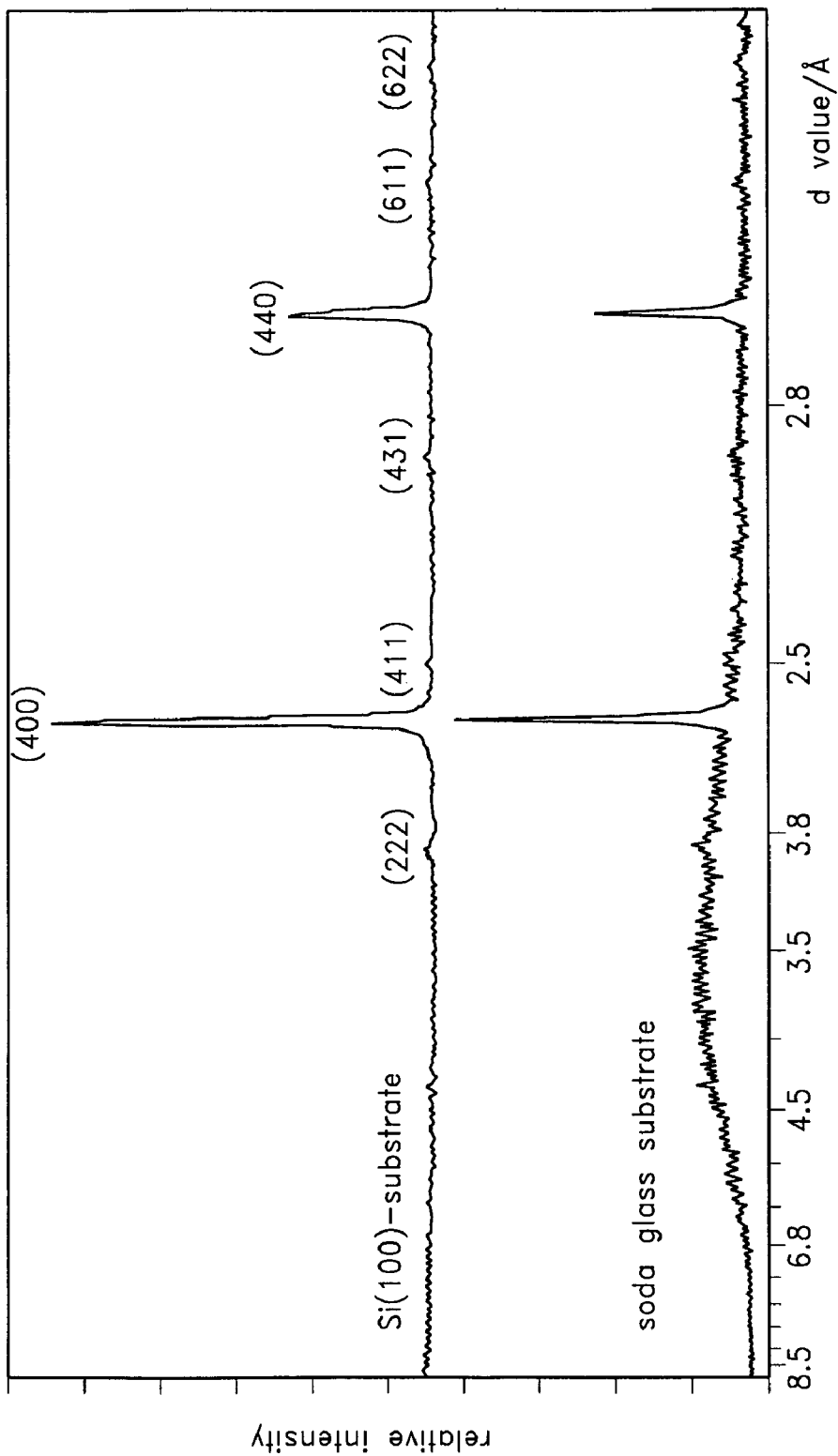
FIG. 3 shows X-ray diffraction patterns for 280-nm $Y_2O_3$ films on Si(100) and soda lime glass substrates, the deposition temperature being 350° C. (Putkonen et al.). Vertical axis shows the relative intensity of XRD peaks, and the horizontal axis shows the d values [Å].
Figure 4:
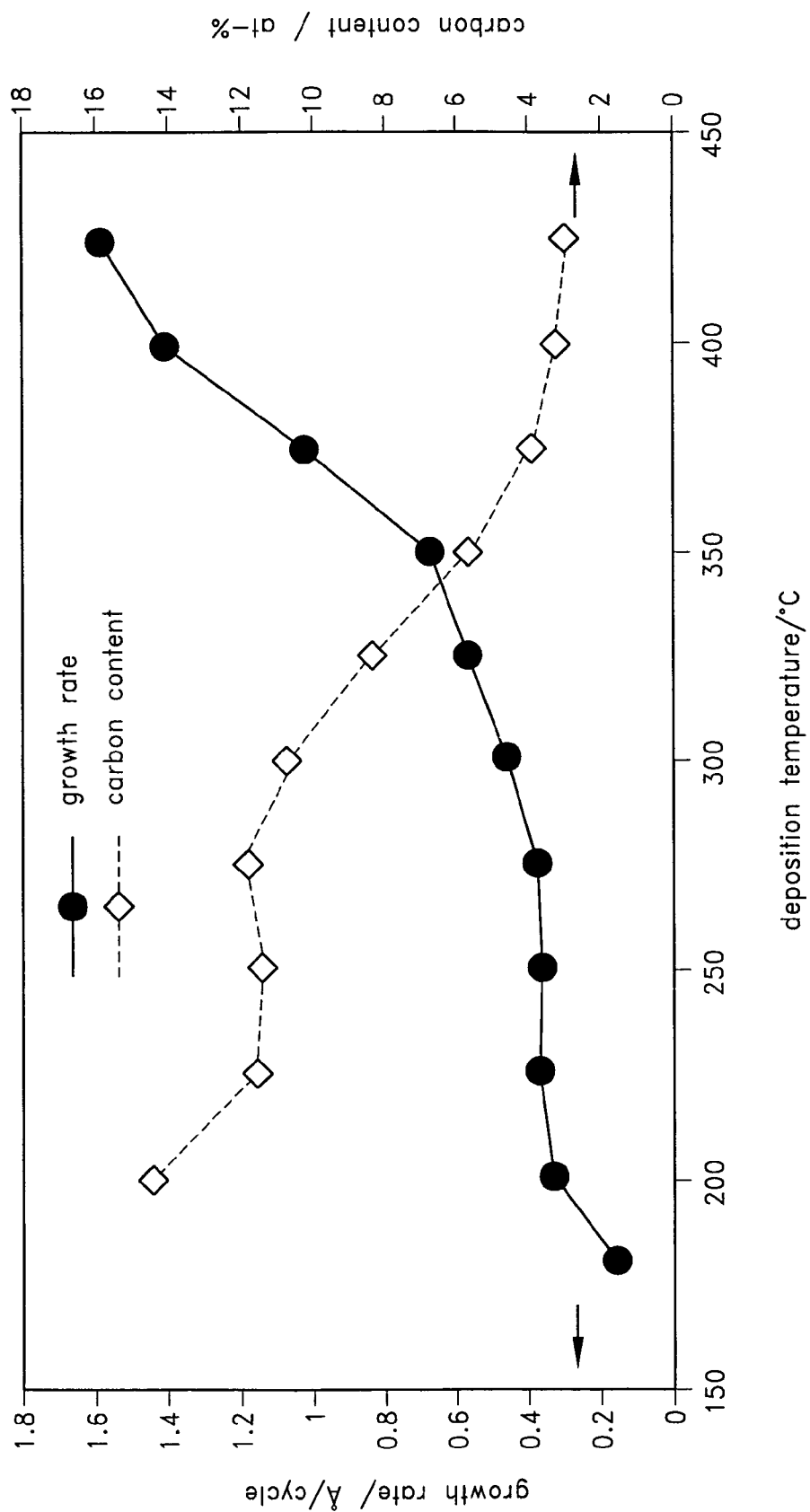
FIG. 4 shows the dependence of the thickness and the carbon content of the $La_2O_3$ thin films on the deposition temperature according to Nieminen et al. The vertical axis on the left shows the growth rate [Å/cycle], the vertical axis on the right shows the carbon content [at –%], and the horizontal axis shows the deposition temperature [° C.].

By aid of the present invention a growth rate of 1.25 to 1.35 Å/cycle for $Y_2O_3$ thin film is achieved when $(CpMe)_3Y$ and water are used as the source materials and the deposition temperature is in the range of 200-400° C. (ALD window). Thickness of the grown films is linearly dependent to the number of the deposition cycles. Films are polycrystalline with the dominant reflection of (400) when low deposition temperatures (200 to 300° C.) are used, whereas (222) reflection is dominant at higher deposition temperatures. The roughness of the surface depends on the deposition temperature. Films grown below 250° C. have the smoothest morphology. Stoichiometric $Y_2O_3$ thin films can be prepared already at such a low temperature as 200° C. The impurity content of the thin films is small.

The growth rate of $Y_2O_3$ thin film on a silicon substrate by using $Cp_3Y$ source material is 1.65 to 1.85 Å/cycle at the deposition temperature range of 250-400° C. Films are polycrystalline with the (222) reflection being dominant. Morphologically uniform films can be grown below 250° C.

According to one embodiment of the present invention, Cp-type rare earth ALD source materials enable over five times faster growth rate of the $Y_2O_3$ film than a process where $Y(thd)_3$ and ozone area used as source materials. Stoichiometry, morphology and crystallinity of the $Y_2O_3$ thin films grown according to the present invention are at least at the same level as those of the films grown with $Y(thd)_3$.

According to one embodiment of the present invention, polycrystalline lanthanum oxide films with smooth morphology can be prepared by $(CpMe)_3La$ already at deposition temperatures of 165-175° C. The deposition rate was found to be from 1.8 to 1.97 Å/cycle.

$Cp_3La$ decomposes at a temperature very close to its evaporation temperature and thus the deposition of the lanthanum oxide films from $Cp_3La$ according to the present invention is problematic. A comparison between $Cp_3La$ and $(CpMe)_3La$ shows the benefit of modifying the Cp ligand. Further modifications of the Cp ligand with, e.g., at least one isopropyl group or more than one Me— (i.e., $CH_3$—) group could improve the volatility and thermal stability of the La compound and widen the ALD growth window of the lanthanum oxide.

Other rare earth oxide thin films, such as $Gd_2O_3$ thin films, can be deposited according to the method of the present invention described above. Low deposition temperature can be used, such as 220-380° C. The lower limit of the temperature range depends on the volatility of the rare earth source compound, because the deposition temperature must be higher than the evaporation temperature of the source compound to avoid the condensation of the source compound on the conduits between the source and the reaction space.

According to still another embodiment of the present invention, two or more different rare earth Cp compounds can be used as metal source materials for depositing a mixture, solid solution or layered structure consisting of at least two different rare earth oxides. It is also possible to dope one rare earth oxide or other metal oxide with at least one other rare earth oxide either homogenously through the thin film or in a graded way so that the concentration of the dopant is gradually increasing from one interface to the other interface of the thin film. A structure with a variable index of refraction can thus be constructed enabling, e.g., novel ways of handling the speed and direction of light.

DEFINITIONS

Generally a "thin film" refers to a thin coating on a surface prepared by any thin film deposition method up to a thickness of approximately 1 μm onto a substrate. Thin films are used in fields of technology for numerous different applications. General range of uses are, inter alia, components in microelectronics, corrosion protecting coatings, applications of optoelectronics, different sensors and magnetic applications.

For the purposes of the present invention, an "ALD type process" designates a process in which deposition of vaporized material onto a surface is based on sequential self-saturating surface reactions. The principles of ALD process are disclosed, e.g., in U.S. Pat. No. 4,058,430 and by T. Suntola (Handbook of Crystal Growth 3, Thin Films and Epitaxy, Part B: Growth Mechanisms and Dynamics, Chapter 14, Atomic Layer Epitaxy, pages 601-663).

One deposition cycle, as referred to as a "cycle," preferably consists essentially of
  feeding a vapor phase pulse of a metal source chemical with the help of an inert carrier gas into the reaction space;
  purging the reaction space with an inert gas;
  feeding a vapor-phase pulse of an oxygen source chemical with the help of an inert carrier gas into the reaction space; and
  purging the reaction space with an inert gas.

When the rare earth metal source chemical is fed into the reaction space it is contacted with the surface of the substrate and bonded by chemisorption to the surface thereof. In the next step the reaction space is purged with an inert or inactive gas to remove any unreacted rear earth metal source chemical from the reactor. These residues are removed in gas phase to avoid any non-ALD deposition. Next, a vapor-phase pulse of a reactive oxygen source chemical is fed with the help of an inert carrier gas into the reaction space, and the oxygen source chemical is reacted with the rare earth metal source chemical bonded to the surface. As a result a rare earth metal oxide is formed on the surface. Finally, the reaction space is purged with an inert gas to remove any unreacted oxygen source chemical from the reactor. The oxygen source chemical is removed in gas phase.

The deposition cycle is repeated until a thin film of required thickness is formed on the substrate.

Yttrium, Gadolinium and Lanthanum Source Materials

Tris(cyclopentadienyl)yttrium ($Cp_3Y$) and tris(methylcyclopentadienyl)yttrium (($CpMe_3Y$) were used as yttrium source materials. Tris(cyclopentadienyl)lanthanum ($Cp_3La$) and tris(methylcyclopentadienyl)lanthanum (($CpMe_3La$) were tested as lanthanum source materials. Russian Science Academy, Institute of Organometallic Chemistry in Nizhny Novgorod, prepared the cyclopentadienyl source materials excluding $Cp_3La$. The manufacturer of the $Cp_3La$ source material was Strem Chemicals, Inc. (Newburyport, Mass., USA, product no 57-3000, 99.9% La). In addition, $Y(thd)_3$ and $La(thd)_3$ were used as source materials in order to carry out a comparison. These thd source materials were synthesized according to the synthetic procedure of Eisentraut and Sievers (Eisentraut, K. J., Sievers, R. E., Volatile rare earth chelates, J. Amer. Chem. Soc. 87 (1965) 5254-5256) and they were purified by sublimation prior to use.

Figure 5B:
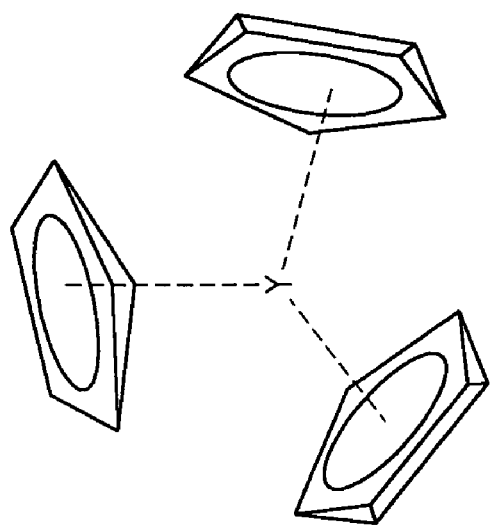
FIG. 5 shows the structure of $(CpMe)_3Y$ (left) and $Cp_3Y$.
Figure 5A:
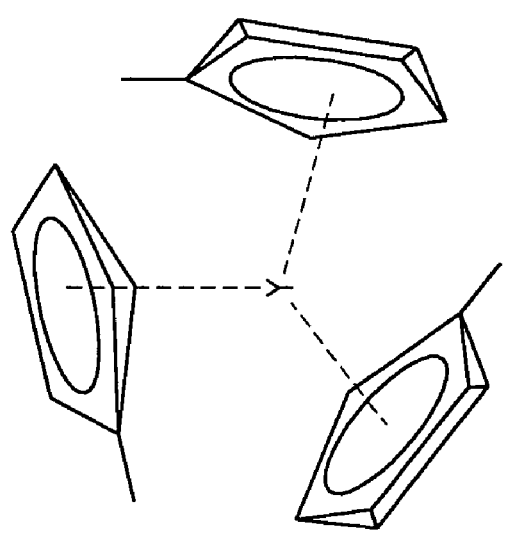

(CpMe)$_3$Y and Cp$_3$Y react with oxygen and humidity, therefore their handling has to be done in an inert atmosphere. The structures of the source materials are shown in FIG. 5. (CpMe)$_3$Y has yellow color and Cp$_3$Y is pale gray. The melting point of Cp$_3$Y is 295° C., but data for (CpMe)$_3$Y is missing in the literature.

The structures of (CpMe)$_3$La and Cp$_3$La are similar with the corresponding yttrium compounds, but the center atom is lanthanum. These compounds are also sensitive to air and humidity. The melting point of (CpMe)$_3$La is 155° C. and the melting point of Cp$_3$La is 395° C.

Tris(cyclopentadienyl)gadolinium ((Cp)$_3$Gd) has a melting point of 295° C. and its vapor pressure within a temperature range of 240-530° C. is given by an equation $\log_{10} p(torr)=11.41-5580/T(K)$. It is said to be air and moisture sensitive. To our experiences, it can be exposed to air shortly while loading the reactor. Analogous cyclopentadienyl compounds exist for essentially all the rare earth elements and they are commercially available from Aldrich and Volatec, for instance.

Rare Earth Source Materials

The present invention generally utilizes various cyclopentadienyl and cyclooctadienyl compounds of rare earth elements. These source compounds can be selected from a group consisting of the following compounds:

(Cp)$_x$M (I);

(Cp)$_x$L$_y$M (II);

(CP)$_x$W$_n$M (III);

(Cp)$_x$L$_y$W$_n$M (IV);

wherein M is Sc, Y, La, Ce, Pr, Nd, Sm, Eu, Gd, Tb, Dy, Ho, Er, Tm, Yb or Lu; Cp is a cyclopentadienyl or a cyclooctadienyl group, so that Cp groups in chemical formulas I-IV can be the same with each other or different from one another; x denotes the number of the Cp ligands and it is an integer from 1 up to the oxidation state of M;

L$_y$ is a neutral adduct ligand that bounds from one or more of its atoms to the rare earth metal and where y denotes the number of the bound ligands; and W is some other ligand with a valence of −1 than Cp and where n denotes the number of the ligands.

W is preferably beta-diketonate or its corresponding sulfur or nitrogen compound, halide, amide, alkokside, carboxylate or Schiff's base. It must be noted that cyclooctadiene is usually shortened as Cod, but here the presentation is simplified by the use of the single common abbreviation Cp for both cyclopentadienyl and cyclooctadienyl.

In the chemical equations I-IV, the cyclopentadienyl and/or cyclooctadienyl groups can be in the same molecule, so that there is a bridge between two Cp-groups consisting of a substituted or unsubstituted C$_1$-C$_6$ chain that may contain a heteroatom selected from Si, N, P, Se, S or B.

L is preferably
(i) a hydrocarbon,
(ii) a hydrocarbon that contains oxygen;
(iii) a hydrocarbon that contains nitrogen;
(iv) a hydrocarbon that contains sulfur;
(v) a hydrocarbon that contains phosphor;
(vi) a hydrocarbon that contains arsenic;
(vii) a hydrocarbon that contains selenium and/or
(viii) a hydrocarbon that contains tellurium.

L is more preferably
(a) amine or polyamine,
(b) bipyridine
(c) a ligand according to a chemical equation

wherein G is —O—, —S—, or —NR$^1$, where R$^1$ is hydrogen or substituted or unsubstituted, cyclic, linear or branched, alkyl, alkenyl, aryl, alkylaryl, arylalkyl, alkoxy, thio, cyano or silyl group. A cyclic or aromatic ring in R$^1$ may contain a heteroatom. Hydrogen or R$^{1-}$ type substituent may also be attached to the carbon atoms in chemical equation V, or
(d) ether or thioether.

Cyclopentadienyl or cyclooctadienyl group Cp in chemical formulas I-IV has a form:

Cp'R$_m$H$_{a-m}$ (VI)

wherein m is an integer 0-8, when a is 8 and m is an integer 0-5 when a is 5,

Cp' is fusioned or isolated cyclopentadienyl or cyclooctadienyl and

R is a hydrocarbon fragment containing 1-20 carbon atoms, preferably C$_1$-C$_6$ hydrocarbon.

R ligands can be the same with each other or different from one another. R can be a substituted or unsubstituted, cyclic, linear or branched, alkyl, alkenyl, aryl, alkylaryl, arylalkyl, alkoxy, thio, cyano or silyl group. The cyclic or aromatic ring of the substituent may contain a hetero atom. Examples of the substituents are methyl, ethyl, propyl, and isopropyl groups.

Neutral adduct ligands L shown in chemical equations II and IV can be ethers, amines or solvent molecules such as tetrahydrofurane that form a bond to the metal with one atom. Examples of suitable neutral adduct ligands that form a bond to a metal with several atoms are polyethers and polyamines.

Oxygen Source Materials

"Reactive oxygen source" as used herein refers to any oxygen-containing source material capable of forming rare earth oxide on a substrate when the said oxygen-containing source material vapor is contacted with the rare earth compound that has chemisorbed on a substrate. The reactive oxygen source may consist of atomic oxygen (i.e., oxygen plasma), molecular oxygen (i.e., O$_2$ and/or O$_3$), oxygen radicals (such as OH) or oxygen bound to other atoms in a molecule (such as H$_2$O, H$_2$O$_2$, organic peroxides or peracids).

At least one oxygen source material is selected from a group consisting of, but not limited to:
water H$_2$O, hydrogen peroxide H$_2$O$_2$ and mixtures of H$_2$O and H$_2$O$_2$;
oxygen O$_2$, ozone O$_3$ and mixtures of O$_2$ and O$_3$, and
oxygen plasma
oxygen radicals
organic peroxides or peracids Water or mixtures of O$_2$ and O$_3$ are preferably used as oxygen sources.

Substrates

"Substrate" as used herein refers to any layer or structure over which a rare earth oxide thin film is to be grown. A substrate may comprise a silicon wafer or silicon layer, such as polysilicon, epitaxial silicon or amorphous silicon, with or without dopants for electrical conductivity. A substrate may also comprise a wafer or layer consisting of silicon-germanium (SiGe) alloy or silicon doped with germanium. A substrate may also comprise a GaAs wafer or GaAs layer, or any other III-V compound (such as GaN or InP) wafer or layer, or ternary or quaternary III-V compound (such as $Al_xGa_{1-x}As$ or $In_xGa_{1-x}As_{1-y}P_y$, respectively) wafer or layer, where x and y denote arbitrary real numbers from 0 to 1. A substrate may also comprise a metal oxide layer, such as high dielectric constant metal oxide [e.g., $Ta_2O_5$, $TiO_2$, $BaSrTiO_x$(BST) or $PbZrTiO_x$(PZT)]. A substrate may also comprise a metal nitride layer (e.g., TiN or TaN or a metal layer (e.g., Ti, Ta, W, Ru, Pt or Pd). A substrate may also comprise glass such as soda lime glass, borosilicate glass or quartz glass.

In the examples below, Si(100) and soda lime glass cut into 5×5 cm² pieces were used as substrates. Soda lime glasses and silicon pieces were washed in ultrasonic washer for 10 min in ion exchanged water and for 10 min in ethanol (Etax A, Primalco).

ALD Reactors

The rare earth oxide thin films of the present invention can be deposited in various types of ALD reactors including cluster tool modules and stand-alone reactors optionally equipped with a load-lock chamber. The deposition pressure is typically in the range of 1-50 mbar, preferably 1-20 mbar, although lower deposition pressures can be used as well. The oldest deposition reactor used for the experiments had a deposition pressure range of 1-2 mbar, but it must be noted that the pressure range was limited by the design of the reaction chamber and the exhaust line and the choice of the vacuum pump, and not limited by the properties of source materials or surface reactions.

Thickness Measurements of the Deposited $Y_2O_3$ and $La_2O_3$ Thin Films

Thickness of the metal oxide films were measured by spectrophotometer, reflectometer and for some films with TOF-ERDA. Analyzing of samples was focused on the films grown on silicon substrate.

Determining the Crystallinity of the Deposited $Y_2O_3$ and $La_2O_3$ Thin Films Crystallinity of the thin films was evaluated by a Philips PW 1800 X-ray diffraction device. Ni-filtered CuKα line (λ=1.5406 Å) was used in measurements.

Surface Morphology of the $Y_2O_3$ and $La_2O_3$ Thin Films

Morphological studies were performed with an atomic force microscope, model Nanoscope III Multimode SPM (Digital Instruments Ltd., Santa Barbara, Calif., USA), on the films grown on silicon substrate. All measurements were carried out with an oscillating, i.e., tapping function mode. About 1 cm² samples on Si(100) substrate were used for the measurements. Surface morphology of the samples was first measured with relatively large scanning field (20 µm×20 µm), after which an area of 2 µm×2 µm was measured in more detail. The scanning frequency was 1-2 Hz. Validity of the data was checked by repeating the measurements after changing the probe tip. Integrated silicon inserts (Nanosensors GmbH, BRD), in length 125 µm, resonance frequency of 200 to 400 kHz and spring constant of 30 to 50 N/m were used as probe tips. Root mean square (rms) was generally used as the value of roughness of the surface, rms being calculated from an equation (7):

$$R_{rms} \sqrt{\frac{\sum_{i=1}^{n}(Z_i - Z_{ave})^2}{n}}$$

wherein, $R_{rms}$=rms roughness (nm)
$Z_i$=height value of single measure points
$Z_{ave}$=mean value of the height values present in the picture
n=number of the measure points in the picture The rms value for roughness states therefore the mean variation of height variation of the surface.

Stoichiometry and the Elemental Composition of the $Y_2O_3$ and $La_2O_3$ Thin Films Elemental composition measurements were carried out from four $Y_2O_3$ thin films with the TOF-ERDA method.

Example 1

Deposition of $Y_2O_3$ Thin Films from $(CpMe)_3Y$ and Water

Figure 6:
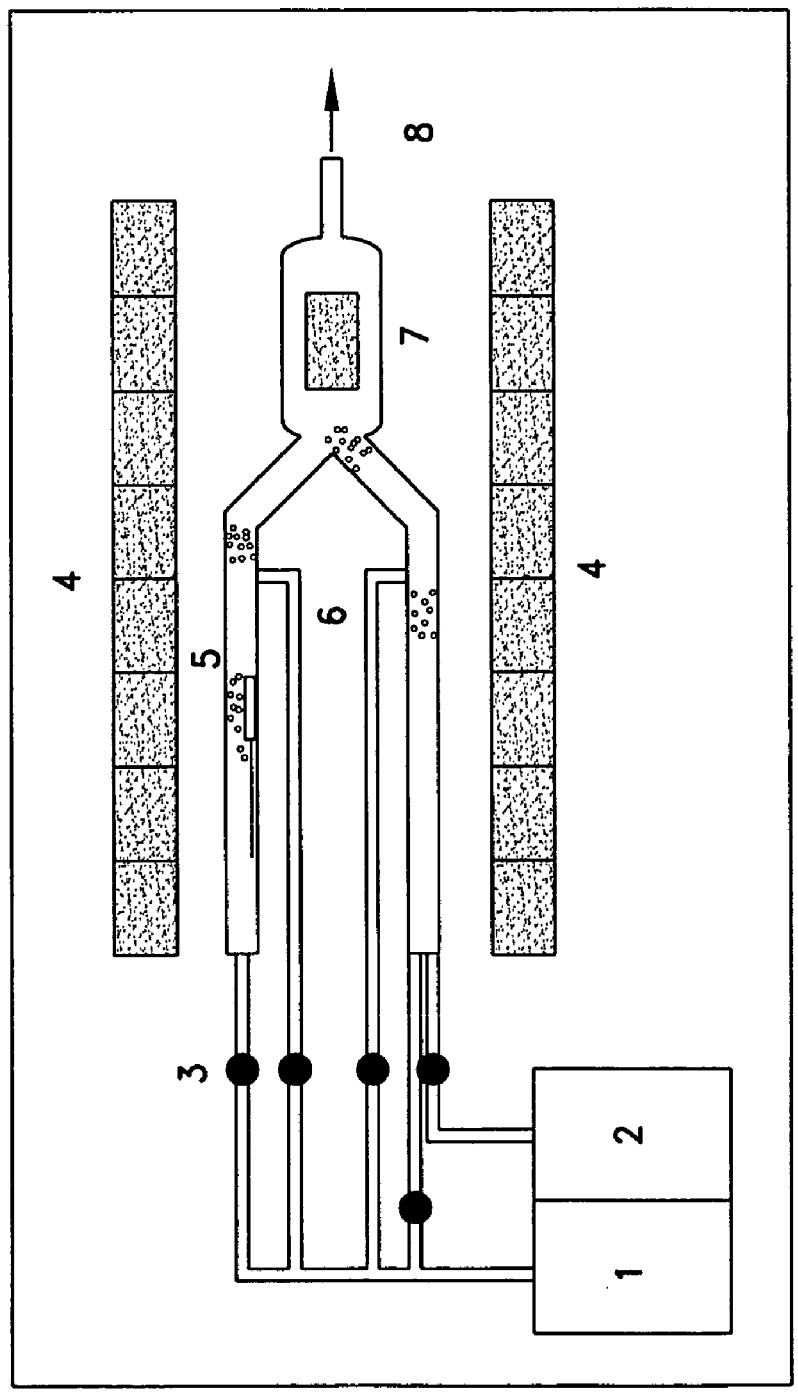
FIG. 6 shows a schematic diagram of the ALD-reactor used for the experiments: 1. $N_2$ generator, 2. $O_3$ generator or formation of water vapor, 3. pulsing valves, 4. heating blocks, 5. source material ship, 6. feeding of the purging pulses, 7. substrate space and 8. outlet conduit for the pump.

Deposition of the $Y_2O_3$ thin films were performed in a flow-type F-120 reactor manufactured by ASM Microchemistry Ltd. The schematic diagram of the reactor used is shown in FIG. 6. Reactor is provided with eight separate heating blocks. The source material was vaporized at the evaporation temperature in the first block and conveyed with the aid of pulsed carrier gas ($N_2$) into the substrate space. Because of the increasing temperature gradient from the source to the substrate space the source material vapor did not condense on the conduit walls. The source material pulses were separated from each other by inert purging pulses ($N_2$). Nitrogen gas was generated by a nitrogen gas generator (Nitrox UHPN 3000-1). Claimed purity of nitrogen was >99.999%. Deposition pressure was from 1 to 2 mbar. The deposition parameters, such as the number and length of pulses and temperatures of the heating blocks, were controlled by a computer.

The $(CpMe)_3Y$ source material was stored in an argon-filled cabin (Vacuum Atmospheres Company, Hawthorne, Calif., USA). The claimed purity of Ar gas was 99.999% (AGA). Source material boat was filled with $(CpMe)_3Y$ in the cabin before each deposition to avoid exposure to room air. When $(CpMe)_3Y$ reacts with air, its surface darkens in a few minutes. Water was used as the oxygen source for the deposition.

In order to grow a film with uniform thickness, suitable lengths for the source material and purging pulses were determined at the deposition temperature of 300° C.

In order to define the ALD window temperature, series of growth experiments was performed with the same pulsing times in the temperature range from 175 to 450° C. The number of the deposition cycles was set to 1000.

In order to determine the linearity of the growth rate, the number of the growth cycles were changed from 500 to 4000.

The effect of the length of the pulses on the smoothness of the film was examined in the deposition temperature of 250° C. The length of the $(CpMe)_3Y$ pulse was varied between 0.7 and 1.5 s and the length of the water pulse between 0.7 and 2 s.

Also the effect of the lengthened pulses on the growth of $Y_2O_3$ at deposition temperatures of 200-300° C. was studied.

Suitable evaporation temperature for $(CpMe)_3Y$ was 110 to 135° C. depending on the reactor type. Initially 300° C. was selected as the deposition temperature. Pulse length of the metal source material and water used as oxidant was 0.7 s and the purging pulse between the source material pulses was and 1.2 s. The number of cycles was 1000. A blue film of uniform quality was obtained as a result for the front and back substrate. The consumption of the source material was about 0.3 mg/cycle. The thickness of the film determined by a spectrophotometer was 124 to 125 nm, corresponding to the growth rate of over 1.2 Å/cycle. That is about five times faster when compared to the use of Y(thd)$_3$ as a source material.

Figure 7:
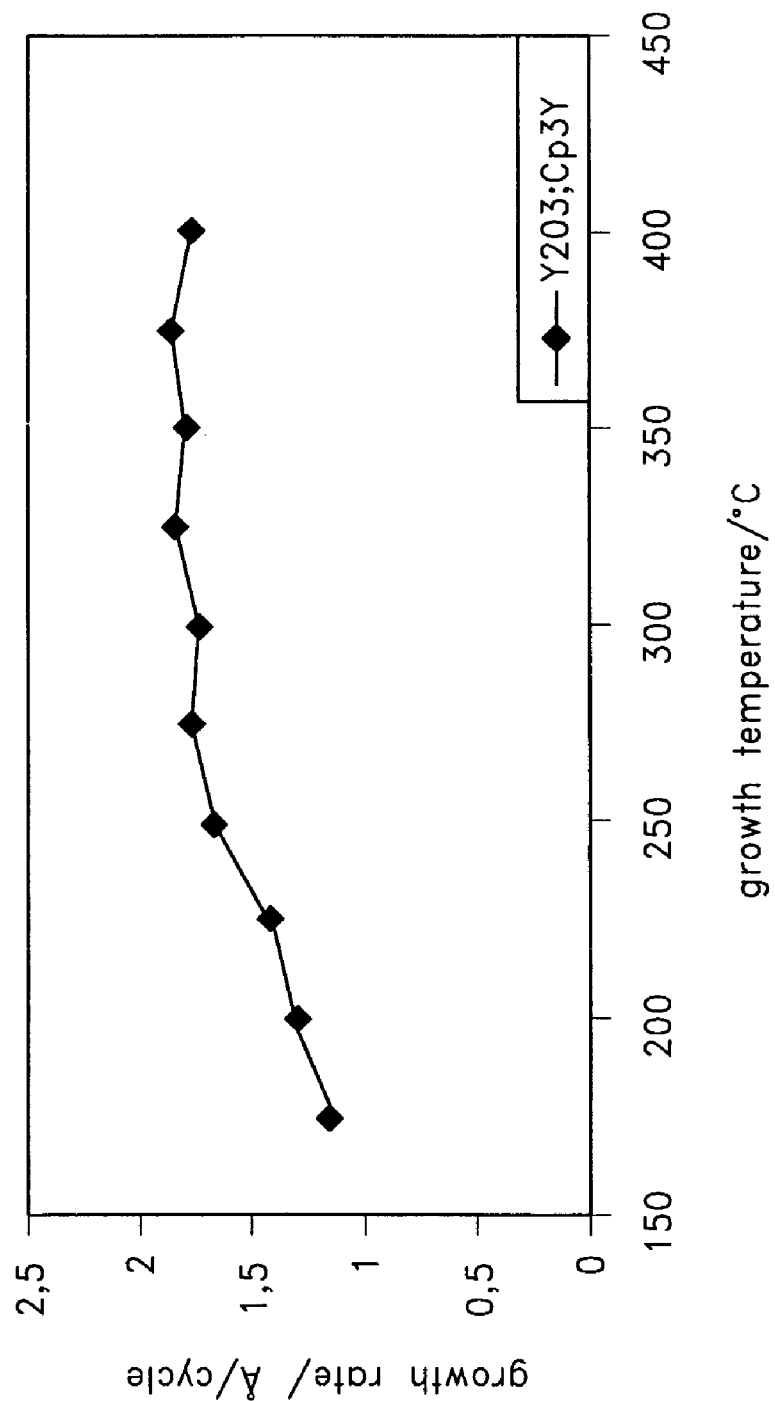
FIG. 7 shows the growth rate of the $Y_2O_3$ thin films at deposition temperatures of 175-450° C. $(CpMe)_3Y$ and water were the source materials. The vertical axis shows the growth rate [Å/cycle], and the horizontal axis shows the deposition temperature [° C.].

The growth rate as a function of the deposition temperature is shown in FIG. 7.

It was found that the ALD deposition window was located between 200 and 400° C. Within this range the growth rate stays between 1.2 and 1.35 Å/cycle. It is clear that within this range, the ALD deposition on the Y$_2$O$_3$ tin films succeeds very well and is reproducible. The source material decomposed when the deposition temperature was 450° C.

Figure 8:
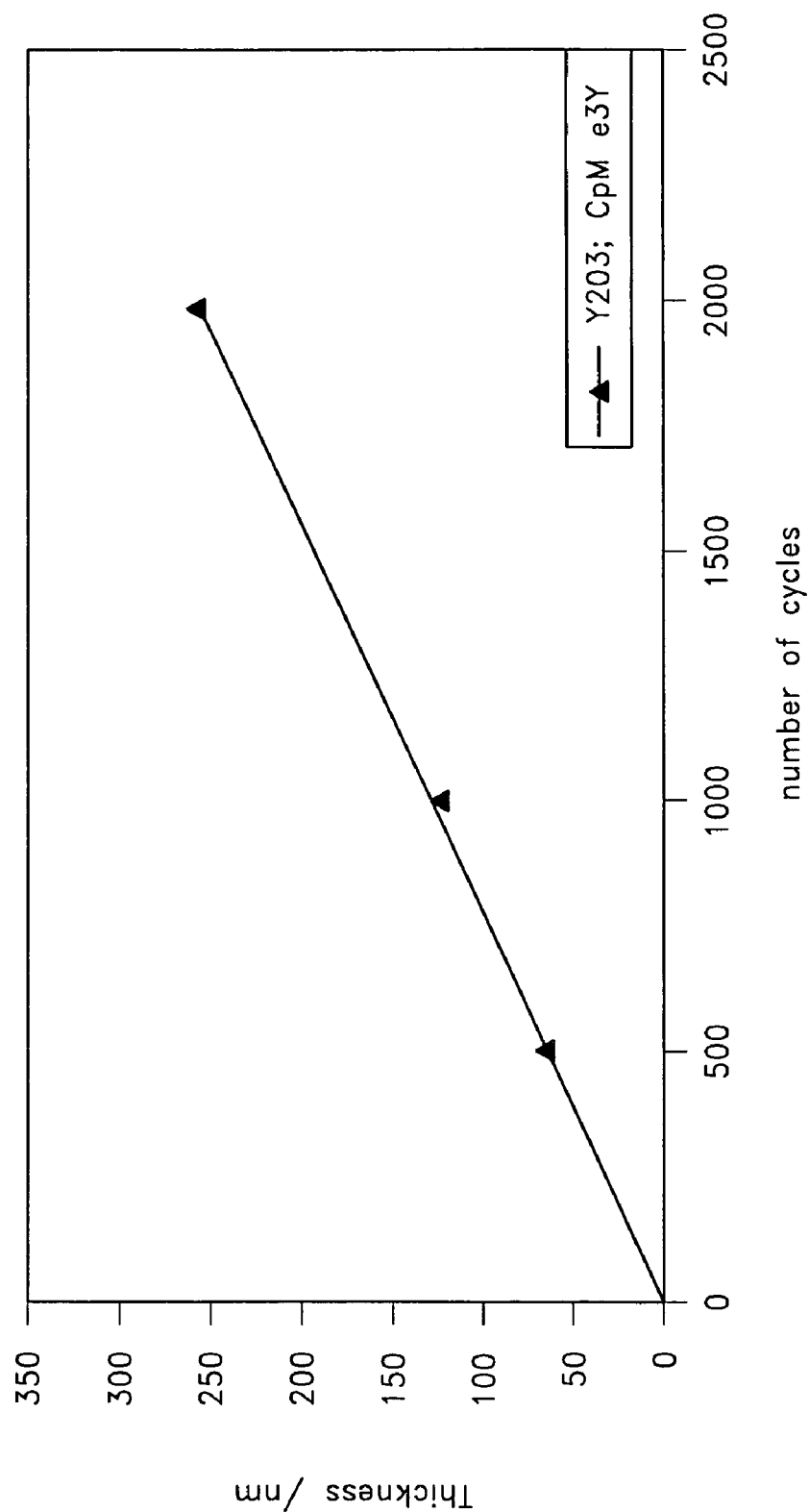
FIG. 8 shows the dependence of the thickness of the $Y_2O_3$ thin films deposited at 300° C. on the number of the deposition cycles, when $(CpMe)_3Y$ and water were the source materials. The vertical axis shows the thickness [nm], and the horizontal axis shows the number of the cycles.

In order to define the linearity of the growth rate as a function of deposition cycles, the number of the cycles was altered form 500 to 2000, the deposition temperature being 300° C. (FIG. 8). Also the duration of the precursor pulses was kept as a constant.

Thickness of the films was found to follow a linear function of the deposition cycles. This in part ensures the presence of an ALD type deposition process.

The Effect of the Length of the Source Material on the Growth Rate

The effect of doubling the (CpMe)$_3$Y source material and purging pulses was studied at deposition temperatures of 200, 250, and 300° C. The pulsing time of the oxidant was not changed. As a result, the consumption of the source material was doubled and the growth rate increased up to 20% at the deposition temperatures of 250 and 300° C., but only about 10%, when the deposition temperature was 200° C. partial decomposition of the source material at higher temperatures or insufficiency of the initial the source material to saturate the surface are possible reasons for the increased growth rate.

The Effect of the Oxidant on the Growth Rate

Increasing the pulsing time of the water vapor used as oxidant from 0.7 seconds to 1.5 seconds had not effect on the growth rate.

Example 2

Deposition of Y$_2$O$_3$ Thin Films from (CpMe)$_3$Y and Ozone

Y$_2$O$_3$ films were grown according to Examples 1, except that ozone and a mixture of ozone and water were used instead of plain water as an oxygen source material.

Fischer Model 502 ozone generator (Fischer Labor-und Verfahrenstechnik GmbH, Meckenheim/Bonn, BRD) generated an ozone-oxygen mixture that had about 3.5% of ozone from pure oxygen (GA, 99.999%).

Si(100) and soda glass were used as substrates. Native oxide layer was not removed from the surface of the Si(100) substrate. The soda glass substrates were on the opposite side with respect to the Si(100) substrates.

Changing the oxidant from water to a mixture of oxygen and ozone (pulsing time 2 s) caused no change on the growth rate. However, when using a mixture of water and ozone, it was observed that a growth rate increased to 1.65 Å/cycle. That is about 30% higher than the value obtained at the same deposition temperature (300° C.) with plain water as the oxidant. It has to be noted that also a three-component mixture of water vapor, oxygen and ozone can be used.

Comparative Example

ALD depositions using Y(thd)$_3$ as the yttrium source material and ozone as the oxygen source.

Y(thd)$_3$ and ozone were used to grow Y$_2$O$_3$ thin films for a comparison. The deposition parameters used by Putkonen et al. were selected.

Suitable evaporation temperature for Y(thd)$_3$ was in the range of 135 to 145° C. Length of the Y(thd)$_3$ source material pulse was 0.7 s and length of the following purging pulse was 1 s. The length of the ozone pulse used as an oxidant was 2 s and the length of the purging pulse was 2 s. All depositions were carried out inside the ALD window determined by Putkonen et al. at the temperature of 350° C. The growth rate of the films were 0.23 to 0.25 Å/cycle, which well corresponds to the studies of Putkonen et al. The results of this experiment are presented later and compared to the results of experiment 1 and 3.

Example 3

Cp$_3$Y as the Yttrium Source Material and Water as the Oxygen Source

The Cp$_3$Y source material is sensitive to air like (CpMe)$_3$Y. Thus, the handling of the source material, loading the source material boat, conveying to the reactor and determining an appropriate evaporation temperature was performed in the same ways as explained in experiment 1. Water was used as an oxidant for the deposition of the Y$_2$O$_3$ thin films.

In order to define an ALD window, depositions of the Y$_2$O$_3$ thin films were performed at temperature range from 200 to 400° C. In order to evaluate the linearity of the growth rate the number of the deposition cycles was varied from 300 to 4000 at a deposition temperature of 300° C. The effect of the length of the source material pulses was studied in the deposition temperature range from 200 to 300° C.

Cp$_3$Y was evaporated at 150-155° C. The length of the pulses of Cp$_3$Y and water was 0.7 s and the purging pulses between the source material pulses were 1.0 and 1.2 s, respectively. The number of the pulses was 1000 and the deposition temperature was 300° C. A yellow, smooth tin film was obtained on Si(100) substrates. The thickness of the film for front substrate was 170 nm and for the back substrate 160 nm indicating excellent thickness uniformity of the film grown on Si(100) substrate. The growth rate (1.7 Å/cycle) was considerably higher than by using the (CpMe)$_3$Y as an Y source (1.25 Å/cycle).

The Effect of the Deposition Temperature on the Growth Rate

Figure 9:
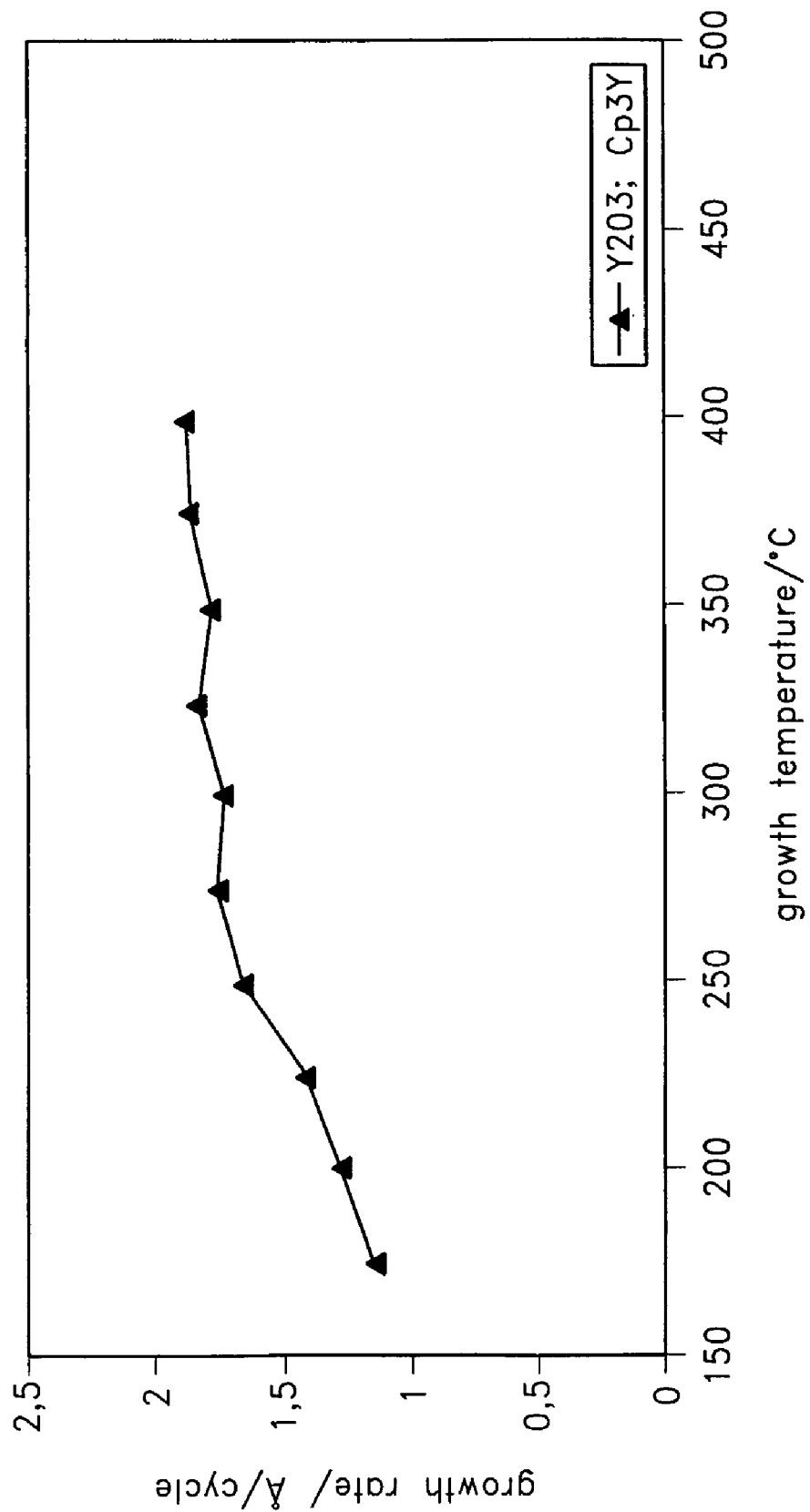
FIG. 9 shows the growth rate of the $Y_2O_3$ thin films at deposition temperatures of 175-400° C. $Cp_3Y$ and water were the source materials. The vertical axis shows the growth rate [Å/cycle], and the horizontal axis shows the deposition temperature [° C.].

The effect of the deposition temperature on the growth rate was studied in a temperature range from 175 to 400° C. (FIG. 9).

The growth rate was very high, up to 1.8 Å/cycle, which is about 50% higher than that obtained with (CpMe)$_3$Y.

Figure 10:
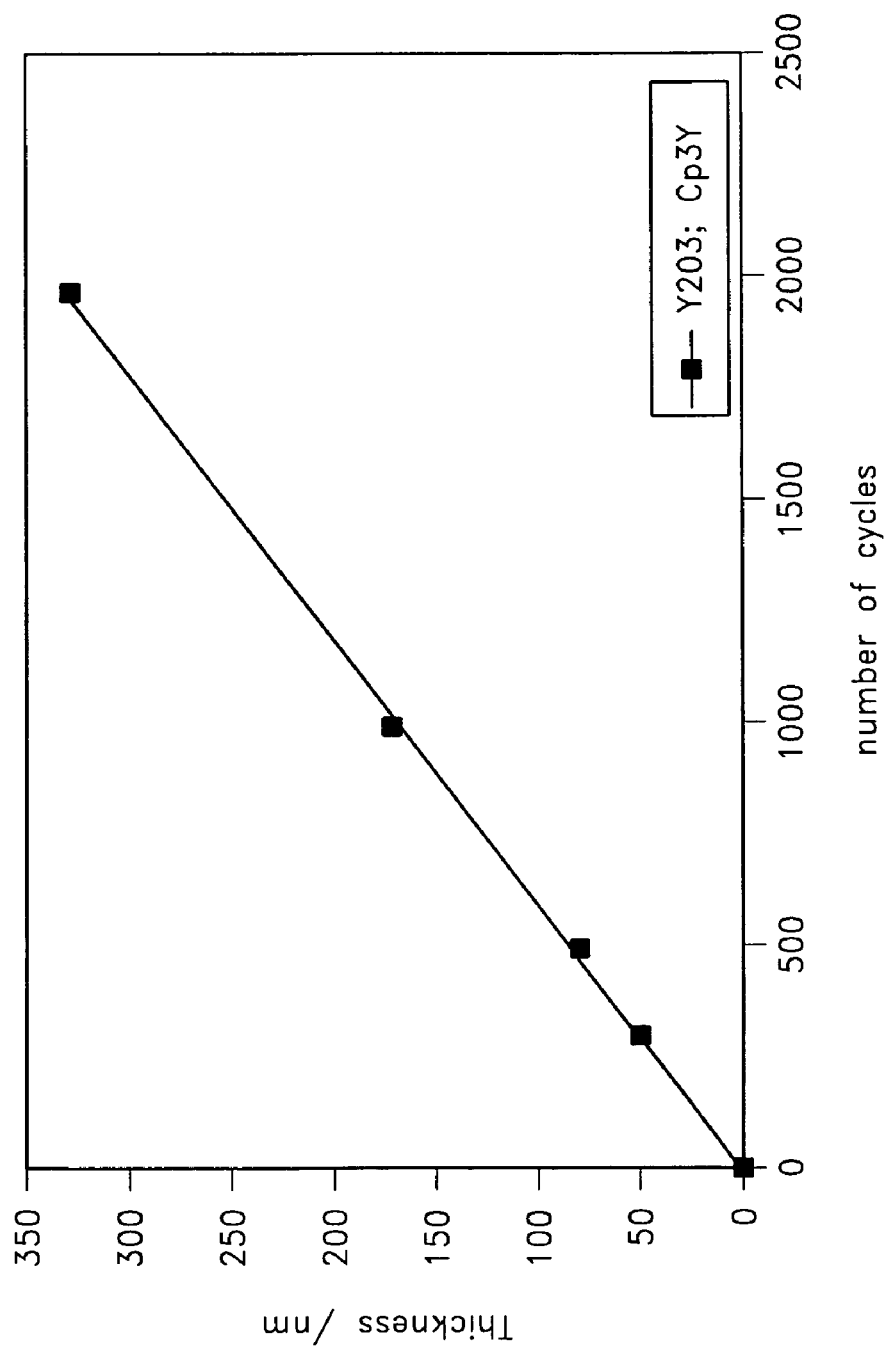
FIG. 10 shows the dependence of the thickness of the $Y_2O_3$ thin film on the number of the deposition cycles, when $Cp_3Y$ and water were the source materials. The deposition temperature is 300° C. The vertical axis shows the thickness [nm], and the horizontal axis shows the number of cycles.

To study the linearity of the growth rate, the number of the deposition cycles was changed from 300 to 2000 by using a deposition temperature of 300° C. (FIG. 10). The pulsing times were constant. The result proved to be similar as in the case of the (CpMe)$_3$Y source material indicating ALD type of growth.

The Effect of the Length of the Source Material on the Growth Rate

Doubling the length of the $Cp_3Y$ source material pulse from 0.7 seconds to 1.5 seconds did not increase the growth rate, when the deposition temperatures were 250 and 300° C. At deposition temperature of 200° C. the growth rate increased less than 10%. The initial pulsing times were sufficient to saturate the whole surface. However, in experiment 1 lengthening the pulse was found to have a clear influence on the growth rate, when $(CpMe)_3Y$ was used as the source material.

Figure 11:
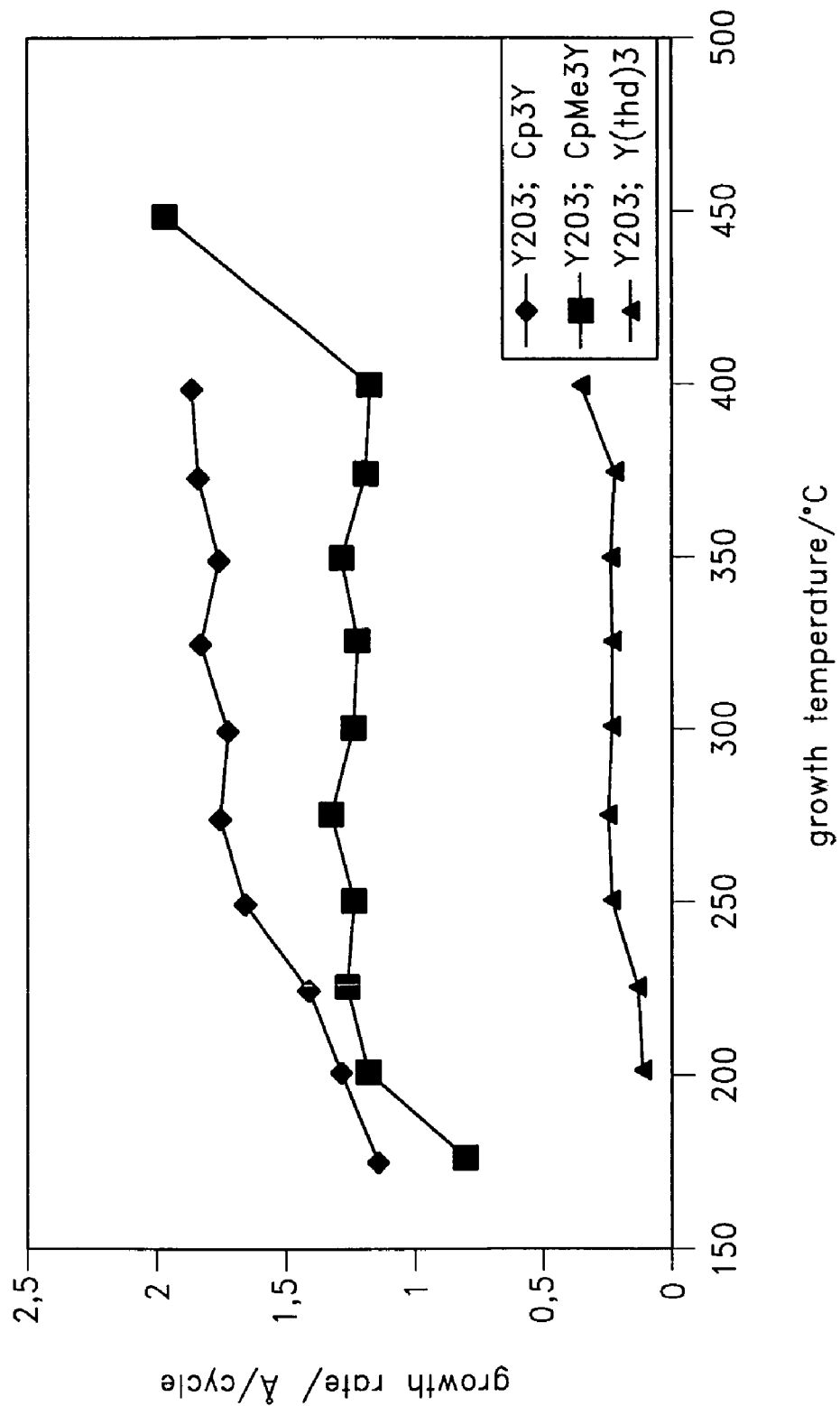
FIG. 11 shows the growth rates of $Y_2O_3$ films grown with different source materials ($Cp_3Y$, $(CpMe)_3Y$ and $Y(thd)_3$) as a function of the deposition temperature. The vertical axis shows the growth rate [Å/cycle], and the horizontal axis shows the deposition temperature [° C.].

A summary of the growth rates of the $Y_2O_3$ thin films deposited from $Y(thd)_3$, $(CpMe)_3Y$, and $Cp_3Y$ as a function of the deposition temperature is shown in FIG. 11. The growth rates of the films deposited with the $Y(thd)_3$ source material are obtained from a study of Putkonen et al.

Stoichiometry and Elemental Composition

Four $Y_2O_3$ thin films were measured by TOF-ERDA: films prepared by using the $(CpMe)_3Y$ source material at the depositing temperatures of 200, 300, and 400° C. and films prepared by using $Cp_3Y$ source material at the deposition temperature of 300° C. A summary of data is presented in Table 1.

The Effect of the Deposition Temperature on Rms Roughness

Figure 12B:
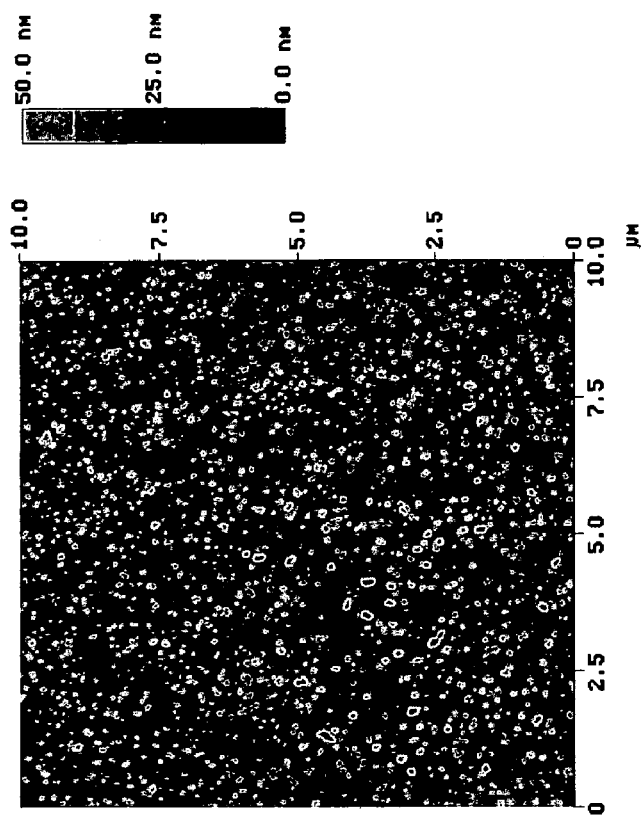
FIG. 12 shows the AFM pictures of the $Y_2O_3$ thin films grown with the $(CpMe)_3Y$ source material. Scanning field was 10 μm×10 μm. a) Deposition temperature 200° C., thickness of the film=120 nm, rms roughness=0.9 nm, z-axis=20 nm, b) 300° C., 125 hm, rms=6.8 nm, z-axis=50 nm.
Figure 12A:
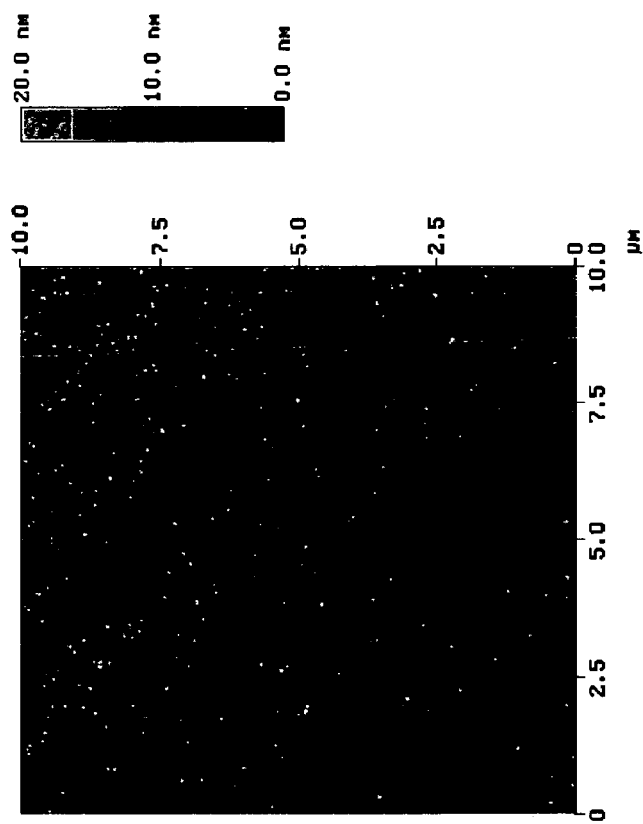

When studying $Y_2O_3$ thin films grown in different deposition temperatures, it was observed that the morphology of the surface depends strongly on the deposition temperature. Two dimensional AFM pictures of the $Y_2O_3$ thin films grown at 200° C. and 300° C. are presented in FIG. 12. $(CpMe)_3Y$ and water were used as the source materials. The number of the deposition cycles is 1000. Scanning area was 10 μm×10 μm. At a deposition temperature of 200° C. the film produced was very smooth when measured from several different points. The value of the rms roughness was 0.9 nm. When the deposition temperature was 300° C., rms roughness was 6.8 nm. Films were almost of the same thickness. The increase of rms roughness is possibly due to the increase of crystallinity. When the deposition temperature was 400° C., the surface turned very rough (rms roughness: ~25 nm).

Similar change in the morphology of the surface when increasing the deposition temperature was observed also with $Y_2O_3$ thin films that were grown by using $Cp_3Y$ as the source material. AFM pictures of $Y_2O_3$ think films with a scanning area of 2 μm×2 μm are presented in FIG. 21. Samples were prepared at various deposition temperatures from a) 200 to f)

TABLE 1

Data of the TOF-ERDA Measurements

| The source material | $T_{deposition}$ [° C.] | Y [at %] | O [at %] | Y/O— ratio | C [at %] | H [at %] | C [at %] | Thickness [nm] |
|---|---|---|---|---|---|---|---|---|
| $(CpMe)_3Y$ | 200 | 36.4 | 55.9 | 0.652 | 0.5 | 6.8 | 0.4 | 110 |
| $(CpMe)_3Y$ | 300 | 37.4 | 55.7 | 0.671 | 0.2 | 3.5 | 3.1 | 110 |
| $(CpMe)_3Y$ | 400 | 39.9 | 58.7 | 0.680 | 0.2 | 0.9 | 0.25 | 120 |
| $Cp_3Y$ | 300 | 39.6 | 58.0 | 0.683 | 0.5 | 1.8 | 0 | 155 |

The theoretical Y/O ratio in $Y_2O_3$ is 0.667. The ratio in analyzed films correlates quite well with the theoretical proportion. The carbon contents were very small compared to the carbon contents of the $Y_2O_3$ thin film grown with $Y(thd)_3$. Increase in the hydrogen content by increasing the deposition temperature was notified also when using the $Y(thd)_3$ source material. When using $Y(thd)_3$ the Y/O ratio increased from 0.39 to 0.62, when the deposition temperature was increased form 200° C. to 400° C. By using $(CpMe)_3Y$ source material, almost stoichiometric $Y_2O_3$ films could be grown already at 200° C. By using the $Cp_3Y$ source material results were very similar to those obtained with the $(CpMe)_3Y$ source material. Chlorine impurity found in the films probably originated from $Ycl_3$ used in the synthesis of the source material.

As a summary of the composition analyses it can be said that the quality of the $Y_2O_3$ thin films grown with the new Cp source materials with regard to elemental composition (stoichiometry, impurities) is clearly better than by using the $Y(thd)_3$ source material.

Morphology of the $Y_2O_3$ Thin Films

The growth of the $Y_2O_3$ thin films starts via nucleation on the substrate surface. During the deposition, the deposition centers or nuclei grow and agglomerate. The surface will remain rough at microscopic scale. As the thickness of the films increases, also the roughness of the surface increases. $Y_2O_3$ tin films are very smooth at macroscopic scale. AFM provides a good chance to study the microscopic smoothness of the surface.

400° C. The number of the deposition cycles was 1000. It has to be noted, that the scale of the z axis varies.

Putkonen et al. have produced MgO thin films by using $Cp_2Mg$ and water as the source materials. In that case a similar dependency was observed between the rms roughness and the deposition temperature of the film.

The Roughness of the $Y_2O_3$ Thin Films as a Function of Thickness

Figure 13:
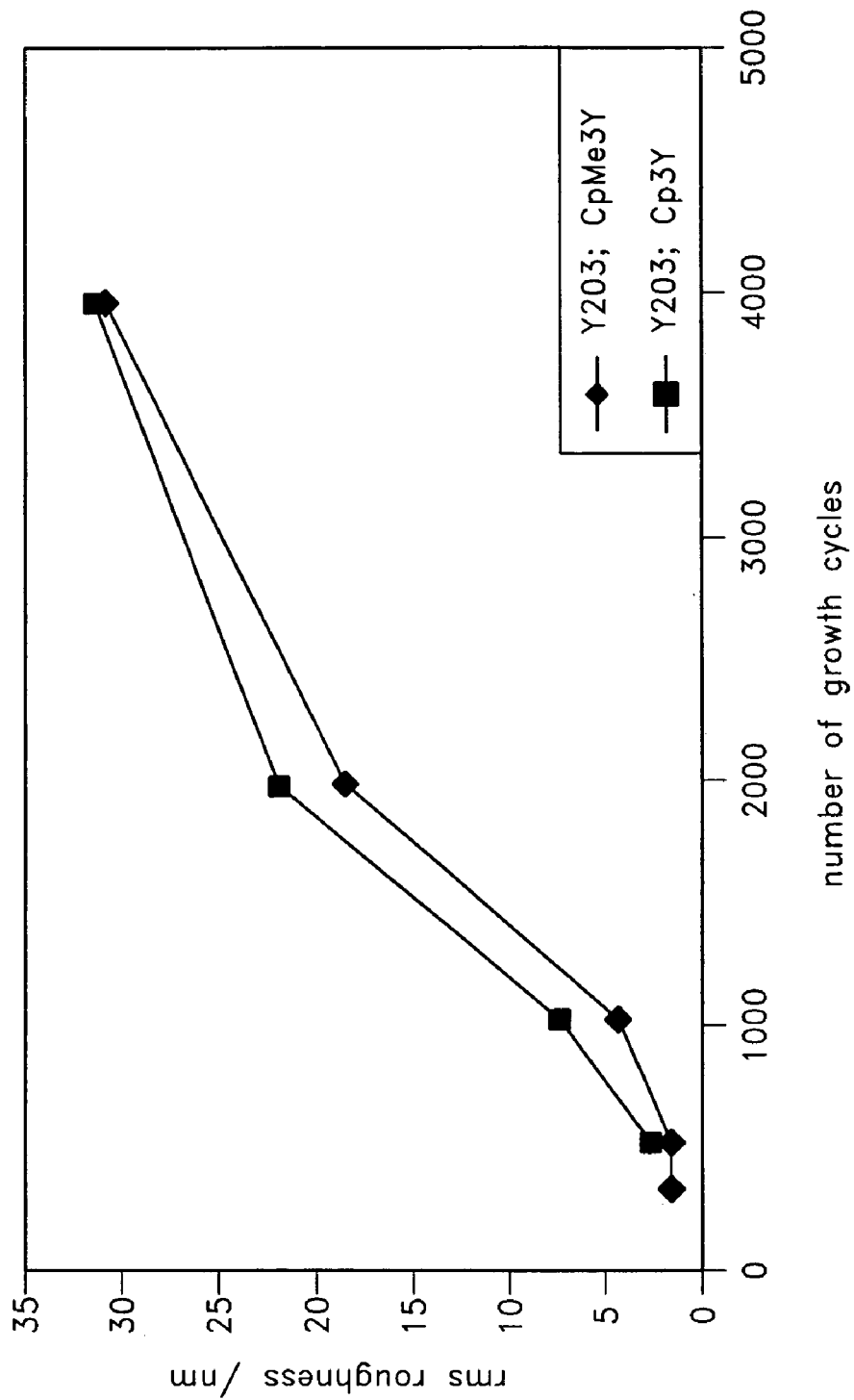
FIG. 13 shows rms roughness of $Y_2O_3$ thin films grown at 300° C. as a function of the number of the deposition cycles with $(CpMe)_3Y$ and $Cp_3Y$ source materials. The vertical axis shows the rms roughness [nm], and the horizontal axis shows the number of cycles.

The rms roughness of the $Y_2O_3$ thin films with regard to the number of the deposition cycles is shown in FIG. 13, when $(CpMe)_3Y$ and $Cp_3Y$ were used as the source materials. The deposition temperature was 300° C. As the growth rate is higher by using $Cp_3Y$ as the source material, also the thickness is greater than by using $(CpMe)_3Y$ as the source material. The differences of rms roughness on films grown with different source materials is explained in this way. The value of the rms roughness is usually quite approximate with very rough surfaces. Since there existed some higher tops in the films, the rms roughness values in the AFM pictures vary within the same sample depending on the area selected for scanning. However, the AFM measurement of the thinner films showed very reproducible data with regard to the rms roughness. When the number of the deposition cycles was 500, the rms roughness for a 65-nm film grown with $(CpMe)_3Y$ was 1.2 nm and for 85-nm film grown on $Cp_3Y$ 2.2 nm. In the studies of Putkonen et al. rms roughness of a 70-nm $Y_2O_3$ film grown at the same temperature with $Y(thd)_3$ was 1.8 nm.

Crystallinity

Figure 14:
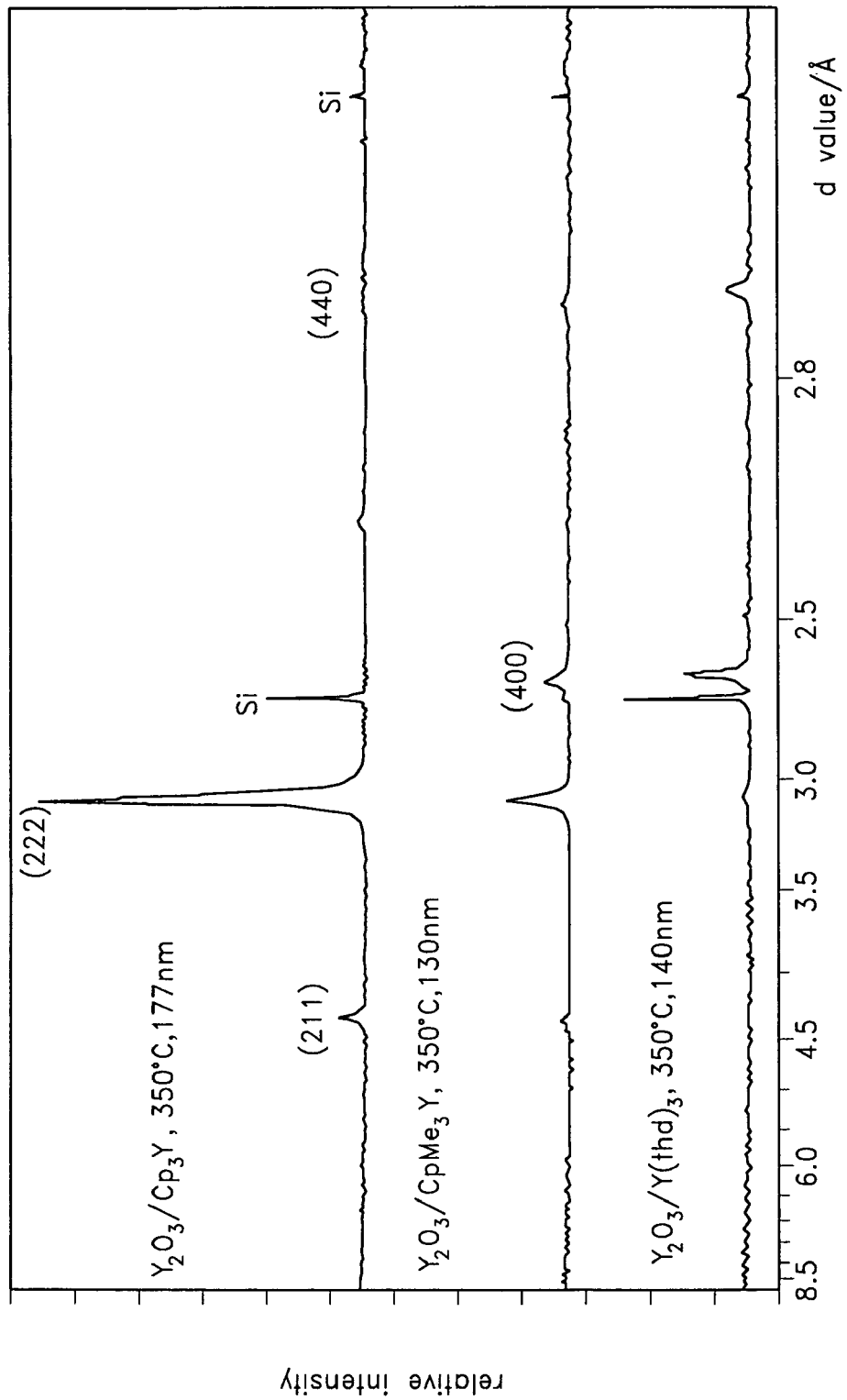
FIG. 14 shows the X-ray diffraction patters of the $Y_2O_3$ thin films grown at 350° C. when $Y(thd)_3$, $(CpMe)_3Y$, or $Cp_3Y$, were used as the source materials. The vertical axis shows the relative intensity, and the horizontal axis shows the d value [Å].

X-ray diffractograms of the $Y_2O_3$ tin films grown with three different source materials at 350° C. are shown in FIG. 14. The thickness of the measured thin films were 130 to 177 nm depending on the source material. Different reflection levels were measured by comparing the data of the measurements and data found from database with different Miller indices of $Y_2O_3$. Polycrystalline cubic $Y_2O_3$ thin films grew with all source materials. Films grown with new Cp compounds were more crystalline than with $Y(thd)_3$. The (222) reflection was notified to be dominant, whereas the (400) reflection was strongest in films deposited from $Y(thd)_3$.

Crystallinity as a Function of Thickness

Figure 15:
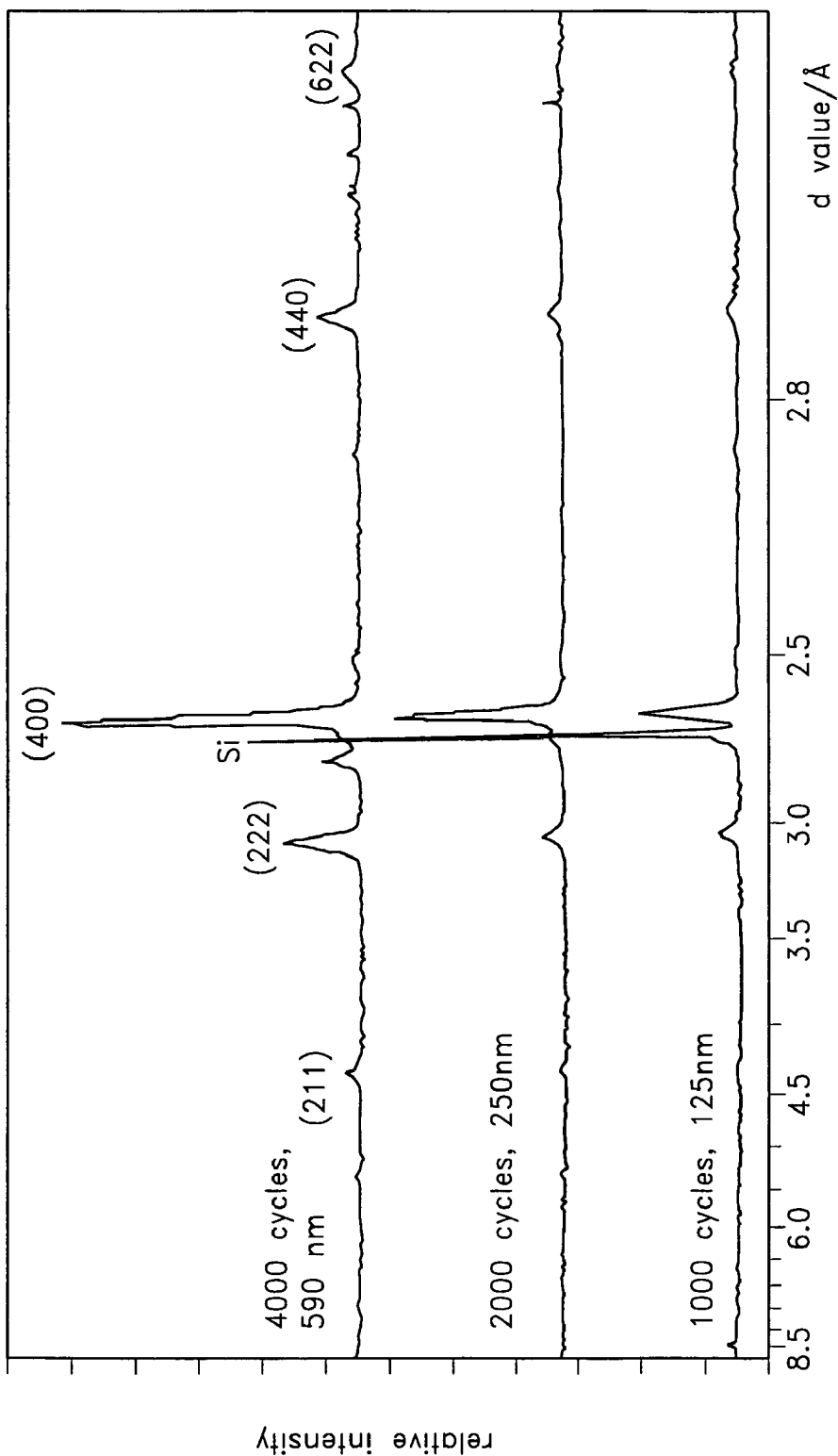
FIG. 15 shows the x-ray diffraction patterns of the 125, 260 and 590-nm $Y_2O_3$ thin films grown at 300° C. with $(CpMe)_3Y$ as the source material. The vertical axis shows the relative intensity, and the horizontal axis shows the d value [Å].

The crystallinity degree of films remains constant while thickness increases. In that case the total intensity of diffraction peaks increase linearly as a function of the thickness of the films. The diffraction patterns of the 125-, 260- and 590-nm $Y_2O_3$ thin films grown at 300° C. with $(CpMe)_3Y$ are shown in FIG. 15. Only the number of the deposition cycles was increased. The other deposition parameters were kept constant.

Similar dependency was observable when using $Cp_3Y$ as the source material.

Crystallinity as a Function of Temperature

Figure 16:
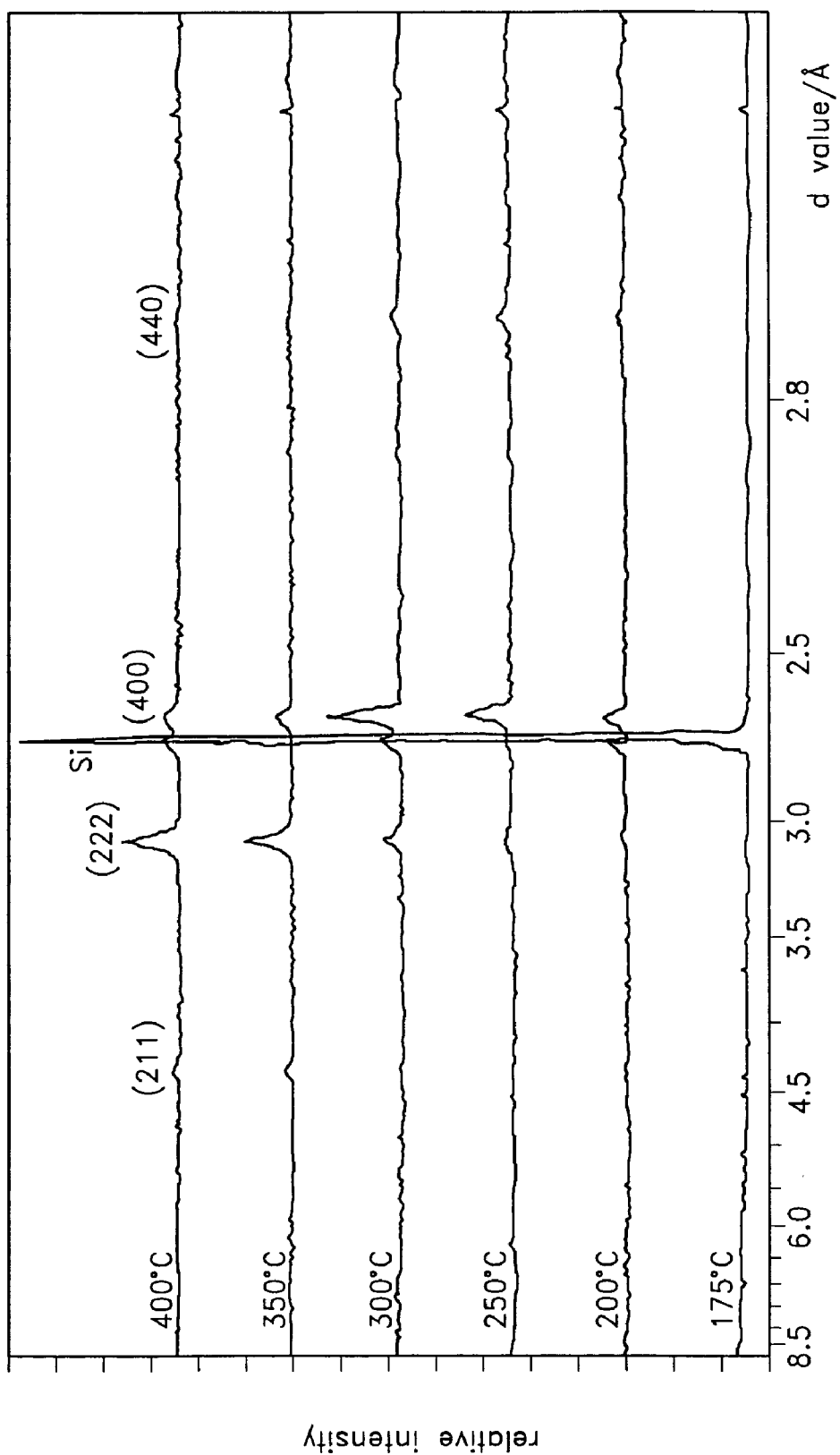
FIG. 16 shows the X-ray diffraction patterns of the $Y_2O_3$ thin films grown at 175-400° C. with $(CpMe)_3Y$ as the source material. The vertical axis shows the relative intensity, and the horizontal axis shows the d value [Å].

Diffraction patterns for the $Y_2O_3$ thin films grown with $(CpMe)_3Y$ at the temperature range of 175-400° C. are shown in FIG. 16. The number of the deposition cycles was 1000. Since the growth rates are different in different temperatures, also the thicknesses of the films are slightly different. However, at the constant growth temperature range (200 to 400° C.) the crystallinity of the samples can be compared. For films grown at 200 to 300° C. crystallinity increased when temperature increased. The dominant reflection was in that case (400). When the deposition temperature was increased the dominant reflection of the polycrystalline film changed into (222).

Figure 17:
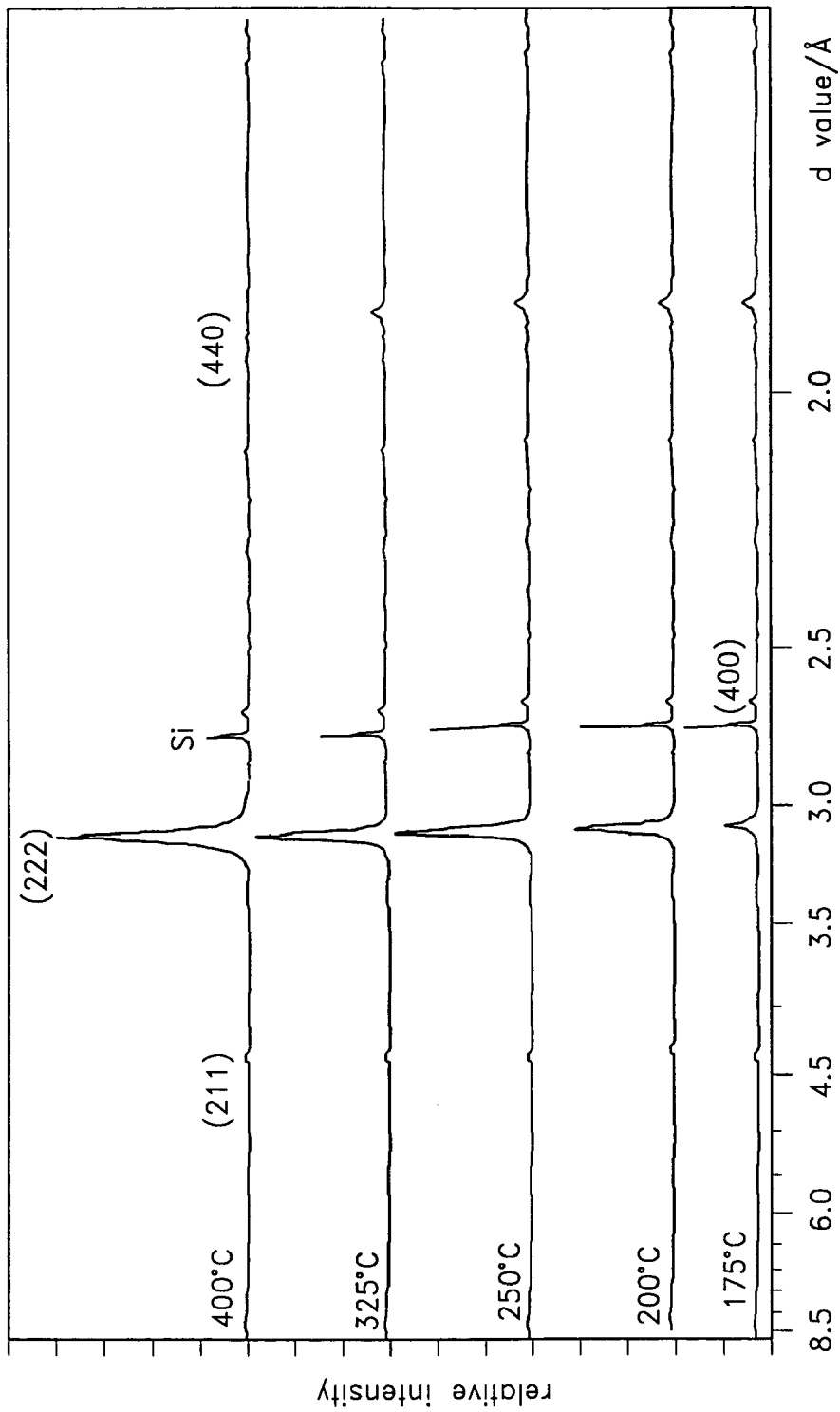
FIG. 17 shows the X-ray diffraction patterns of the $Y_2O_3$ thin films grown at 175-400° C. with $Cp_3Y$ as the source material. The vertical axis shows the relative intensity, and the horizontal axis shows the d value [Å].

When $Cp_3Y$ was used as the source material the dominant (222) orientation was observed through the whole temperature range of 175-400° C. (FIG. 17). Crystallinity of the film increased as expected by increasing the deposition temperature.

The Effect of the Oxidant on Crystallinity

In two depositions $(CpMe)_3$ was used as the metal source material and ozone or a mixture of water and ozone as the oxidant. The number of the deposition cycles was 1000 and the deposition temperature was 300° C. When ozone was used as an oxidant instead of water, crystallinity of the $Y_2O_3$ film increased clearly and the dominant reflection (400) was replaced by (222). However, this result was not confirmed with further deposition.

The Effect of the Substrate Material on Crystallinity

Figure 18:
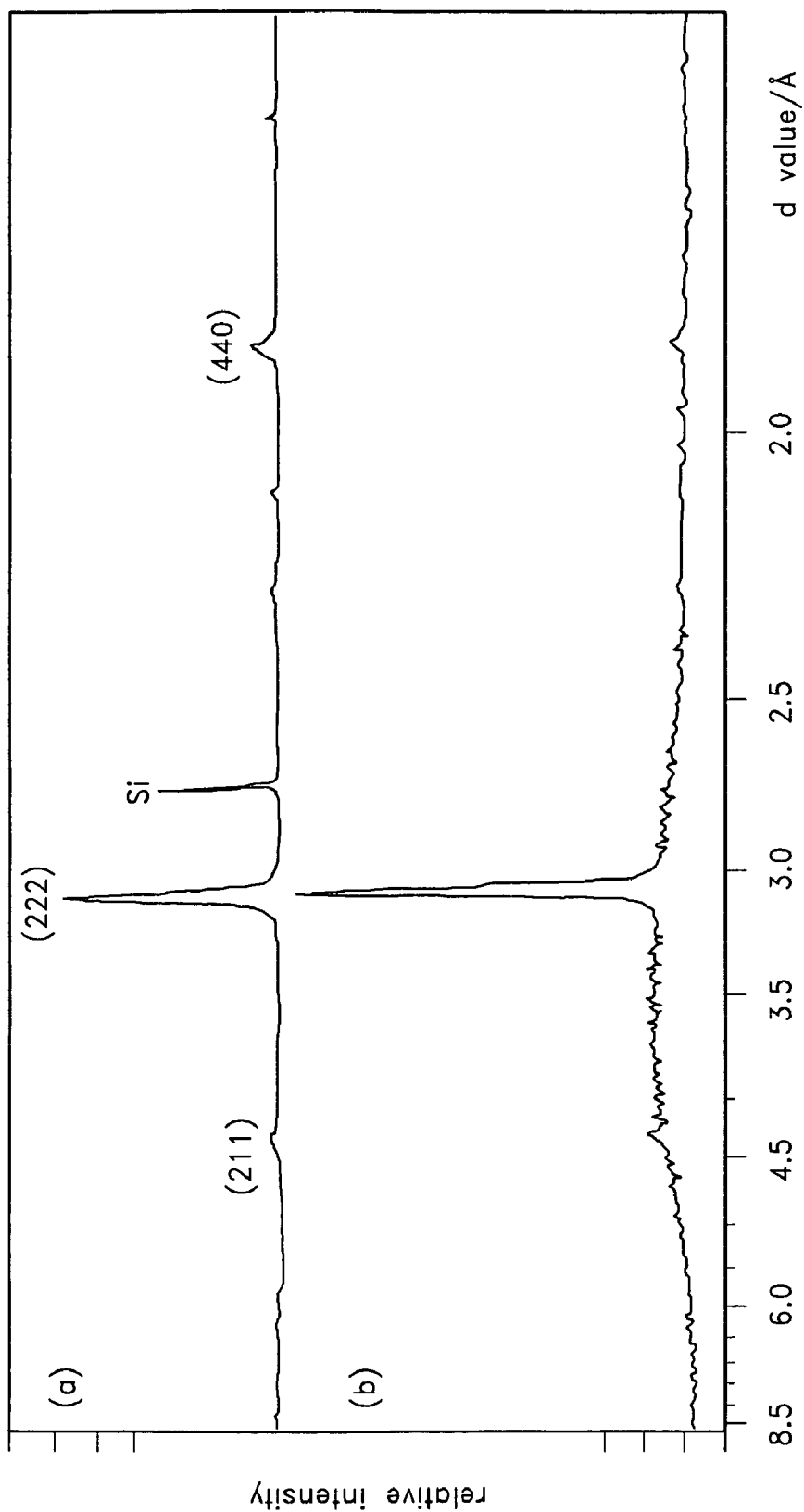
FIG. 18 shows the X-ray diffraction patterns of $Y_2O_3$ thin film deposited by using $Cp_3Y$ as the source material onto a) Si(100) and b) soda lime glass substrate. The deposition temperature was 275° C. and the number of the cycles 1000. The vertical axis shows the relative intensity, and the horizontal axis shows the d value [Å].

X-dray diffractographs for $Y_2O_3$ thin films on Si(100) and soda glass substrates are shown in FIG. 18. $Cp_3Y$ was the source material and the deposition temperature was 275° C. The same reflections were observable for films grown onto both substrates. The intensity of the peaks was noted to be even slightly higher on soda glass substrate (100) than on silicon. The films grown at lower temperatures on glass substrates were amorphous.

Example 4

Deposition of the $La_2O_3$ Thin Films using $(CpMe)_3La$, or $Cp_3La$ as a Lanthanum Source Material and Ozone as Oxygen Source The handling and defining the suitable evaporation temperature of the new source materials, $(CpMe)_3La$ and $Cp_3La$, were carried out in the same way as described in experiment 1. After the determination of the evaporation temperature, suitable deposition conditions for the deposition of the $La_2O_3$ thin films were searched for.

Results from the Deposition of Lanthanum Oxide Thin Films with $Cp_3La$

A suitable evaporation temperature of $Cp_3La$ was determined to be from 250 to 255° C. The pulsing time of the source materials was 1 s and the duration of the purging pulse was 1.2 s. The deposition temperature was 300° C. A strongly non-uniform film was obtained as a result. This was because of decomposition of the source material in the deposition temperatures in question. When the deposition temperature was lowered by intervals of 10° C. down to 260° C., growth of any $La_2O_3$ thin film did not take place. This was noted to be due to decomposition of the $Cp_3La$ source material close to the evaporation temperature.

Results from the Deposition of the Lanthanum Oxide Thin Films with $(CpMe)_3La$

Evaporation temperature of $(CpMe)_3La$ was 155-160° C. By using the same pulsing times and deposition temperatures as in studies of $Cp_3La$, thin films with a strong thickness profile was obtained. By lowering the deposition temperature, decomposition of the source material could be hindered. Finally, at the deposition temperatures of 160-165° C. a smooth film was grown from 1000 cycles. Films were observed to react quite rapidly with air and humidity, which changed their structure. In the studies of Nieminen et al. it was concluded that the $La_2O_3$ films grown from $La(thd)_3$ source material react with humidity. The growth rate of the film on the front substrate was 1.97 Å/cycle and on the back substrate 1.7 Å/cycle. The growth rate was thus five times bigger than when using $La(thd)_3$ as a source material. Because of the reaction of the films with air, the deposited lanthanum oxide films were stored in an Ar-filled cabin.

Example 5

Deposition of Lanthanum Oxide Thin Films with $La(Thd)_3$ for a Comparison

A suitable evaporation temperature was determined to be 170° C. The deposition of the $La_2O_3$ thin film was carried out according to the study of Nieminen et al. in the deposition temperature of 300° C. Since the properties of the grown film was in accordance with the data of Nieminen et al., and thus it gave practically no new knowledge, it was decided to proceed to using new organometallic La source materials.

Crystallinity

Figure 19:
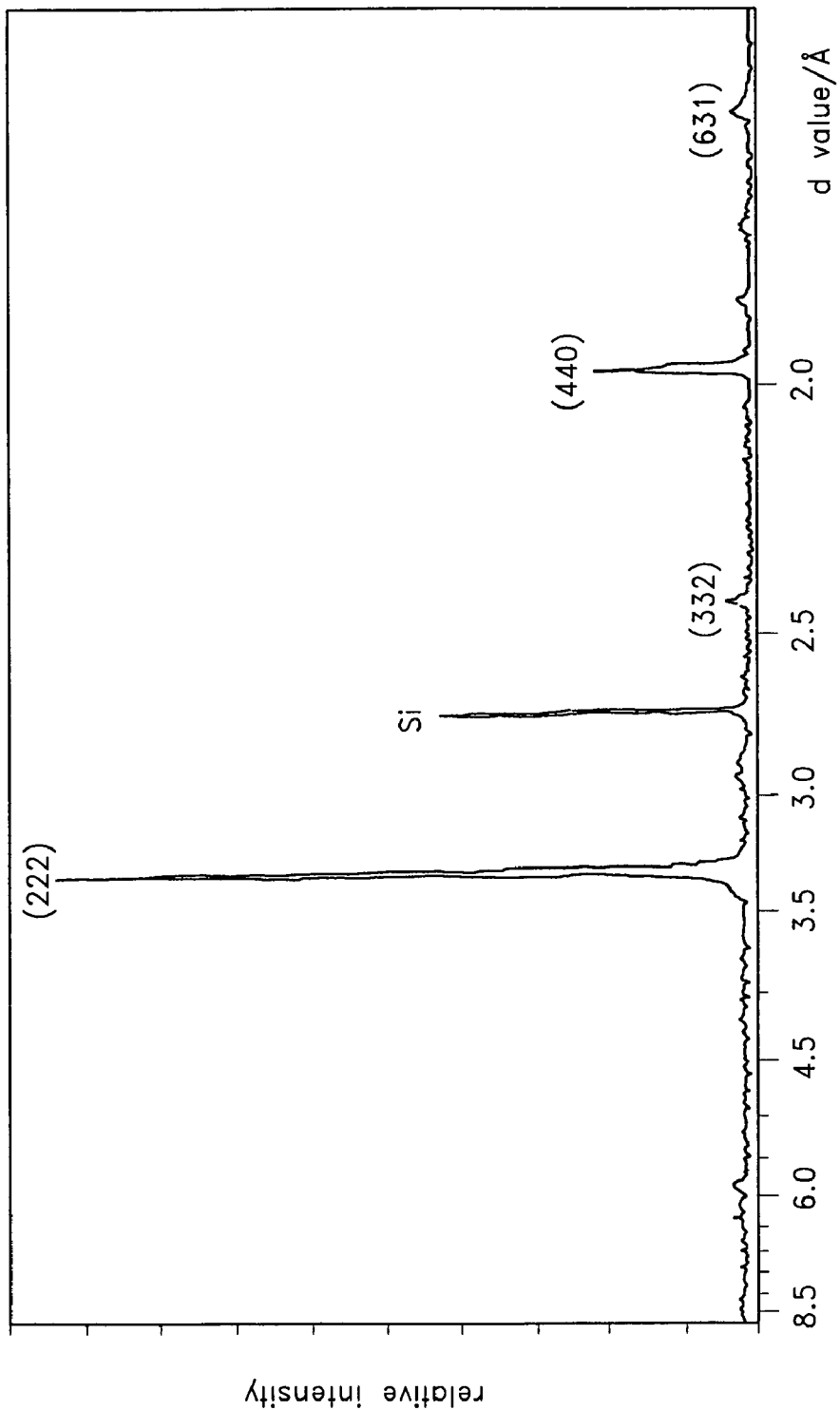
FIG. 19 shows the X-ray diffraction pattern of the lanthanum oxide film grown at 165° C. The number of the deposition cycles was 1000 and the thickness 200 nm. $(CpMe)_eLa$ was used as the metal source material. The vertical axis shows the relative intensity, and the horizontal axis shows the d value [Å].

X-ray diffractograph of the 200-nm lanthanum oxide thin film grown at 165° C. is shown in FIG. 19. $(CpMe)_3La$ and water were the source materials.

The film is polycrystalline and the dominating reflection is (222). Other peaks of the mixed orientation were due to the (440), (332) and (631) reflections. The crystalline structure of the film is cubical, which is metastable. Some of the peaks could not be indexed. Exactly the same X-ray diffraction pattern was also obtained for films grown at 160, 170 and 175° C. However, an (002) orientation belonging to LaO(OH) found in studies of Nieminen et al. could not be observed. In the mentioned study the $La_2O_3$ thin film had a (400) orientation.

Morphology

Figure 20:
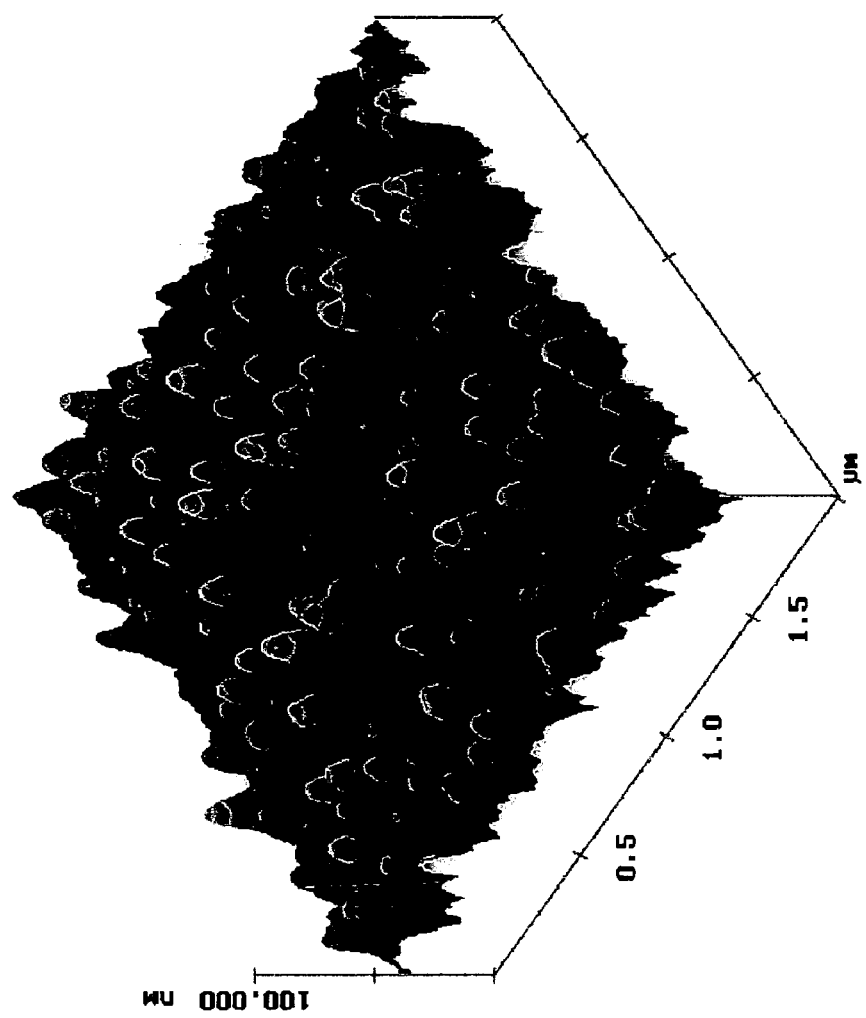
FIG. 20 shows an AFM picture of a 200-nm lanthanum oxide film grown at 165° C. from $(CpMe)_3La$. The measurement area was of 2 μm×2 μm and the number of the deposition cycles was 1000. The rms roughness was 5.9 nm.
Figure 21A:
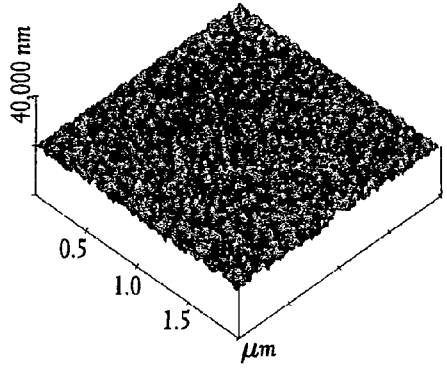
FIG. 21 shows 2 μm×2 μm AFM pictures of $Y_2O_3$ thin films deposited from $Cp_3Y$ and water on Si(100):
  a) deposition temperature 200° C., thickness of $Y_2O_3$ 13-nm, rms roughness 0.65 nm and z-axis 20 nm, b) 225° C., 140 nm, rms=0.75 nm and z=20 nm,
c) 250° C., 165 nm, rms=1.6 nm and z=50 nm,
d) 275° C., 170 nm, rms=7.3 nm and z=50 nm,
e) 350° C., 175 nm, rms=about 22 nm and z=100 nm, and
f) 400° C., 175 nm, rms=about 45 nm and z=200 nm.
Figure 21B:
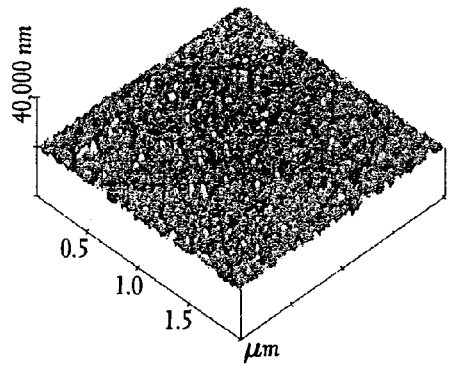
Figure 21C:
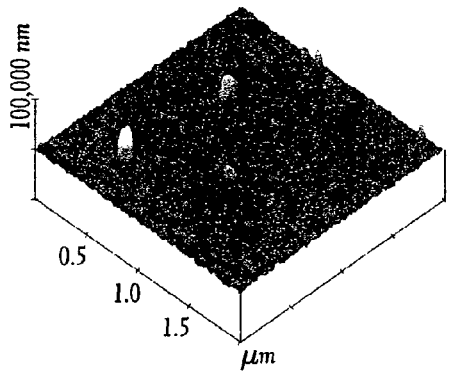
Figure 21D:
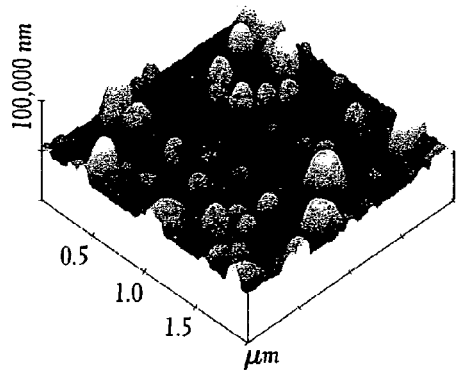
Figure 21E:
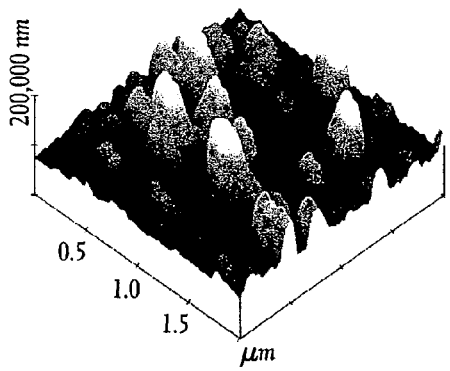
Figure 21F:
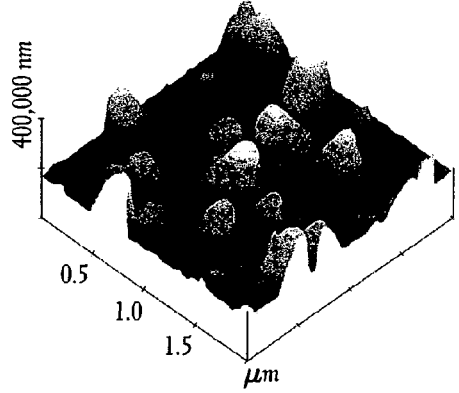

A typical AFM picture of the surface of a lanthanum oxide thin film deposited at 165° C. is shown in FIG. 20. The rms roughness of the 195-nm film was 5.9 nm. The surface is very homogenous in different points of the sample.

Example 6

Tris(cyclopentadienyl) gadolinium (($Cp)_3Gd$) was evaporated at 185° C. and dosed alternately with water onto (100) GaAs, Si and glass substrates. With pulse times of 0.2 seconds for ($Cp)_3Gd$ and 0.5 seconds for water, a growth rate of 0.9 Å/cycle was obtained at 250° C. and 0.6 Å/cycle at 300° C. Lengthening of the ($Cp)_3Gd$ pulse time to 0.5 seconds at 250° C. had no major effect on the deposition rate. Likewise, an experiment where the compound was repeatedly pulsed on a previously deposited $Gd_2O_3$ film at 250° C. gave no indication of decomposition.

Figure 22:
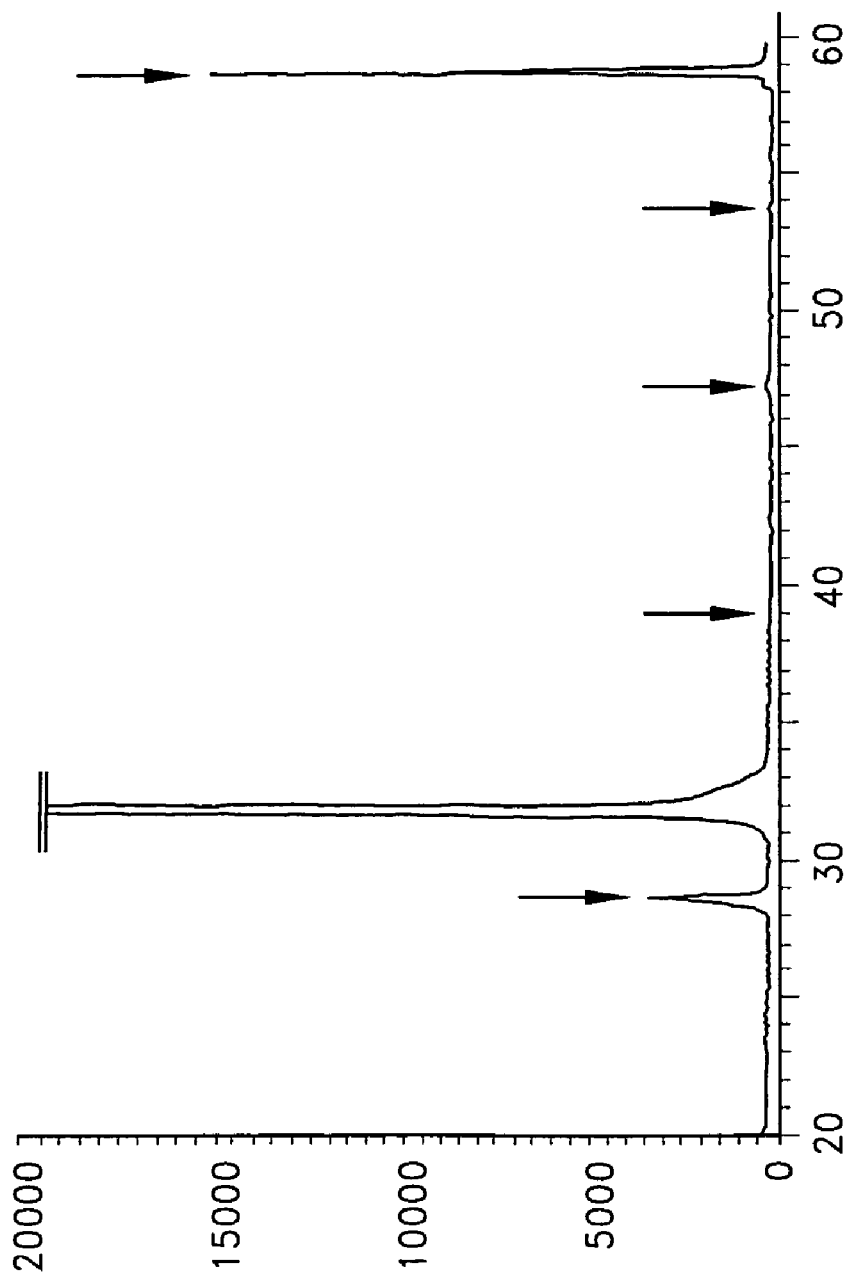
FIG. 22 shows an X-ray diffraction pattern of a 75-nm Gd2O3 thin film grown on GaAs substrate.
Figure 7:
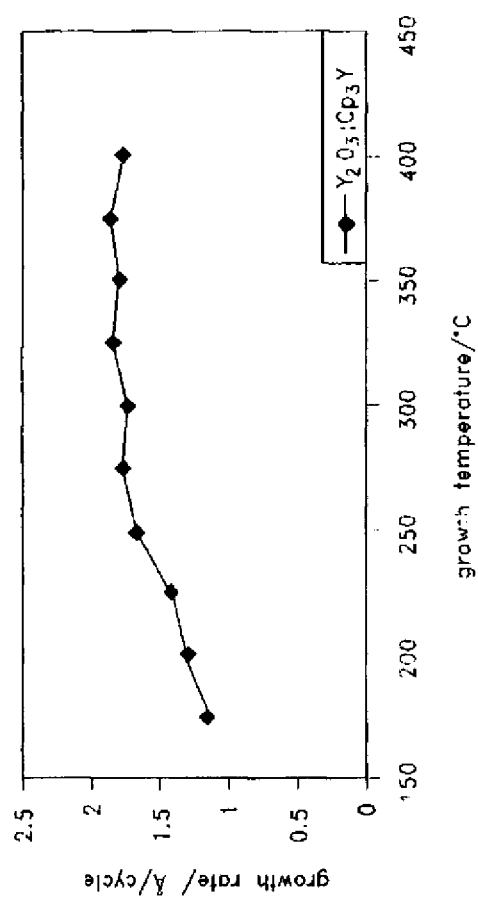
Figure 8:
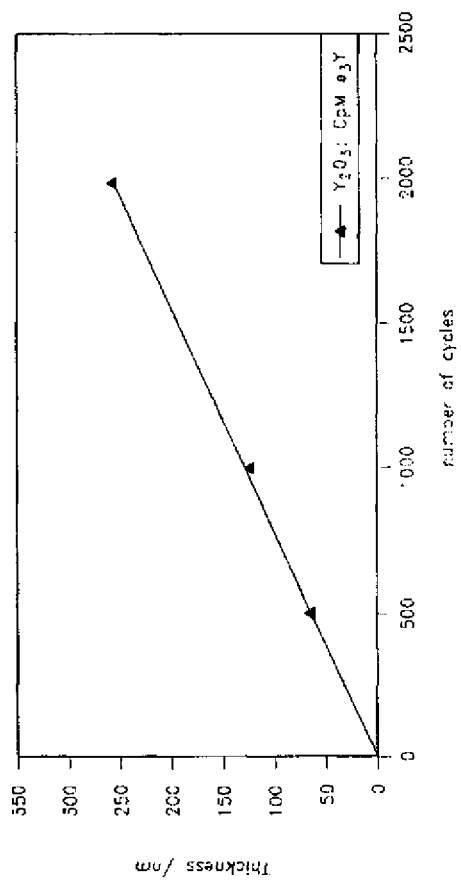
Figure 9:
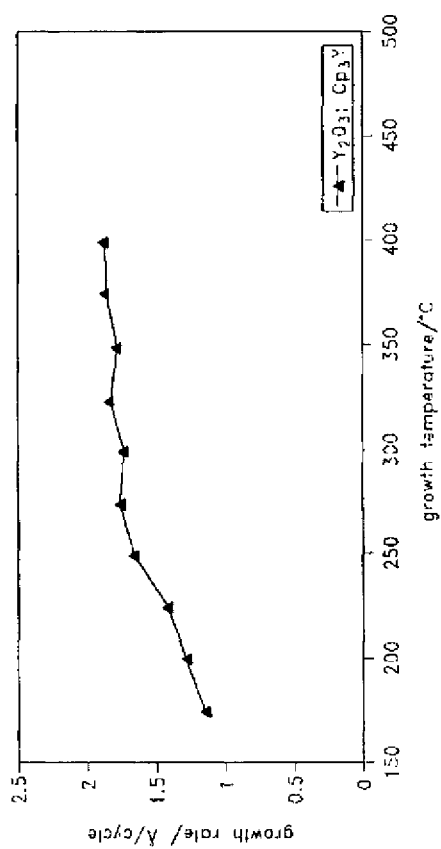
Figure 10:
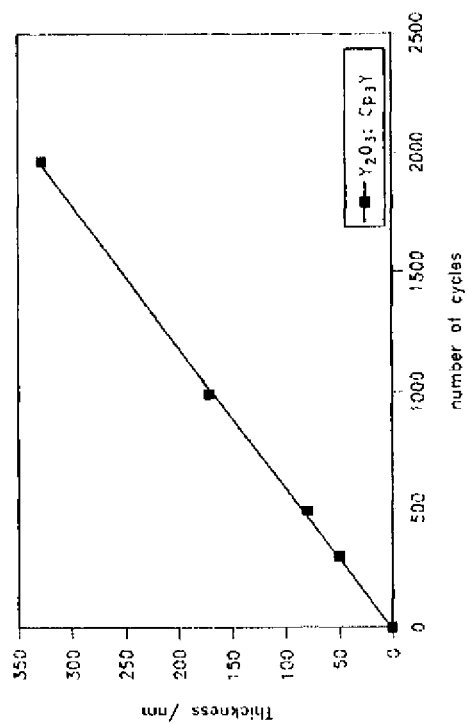
Figure 11:
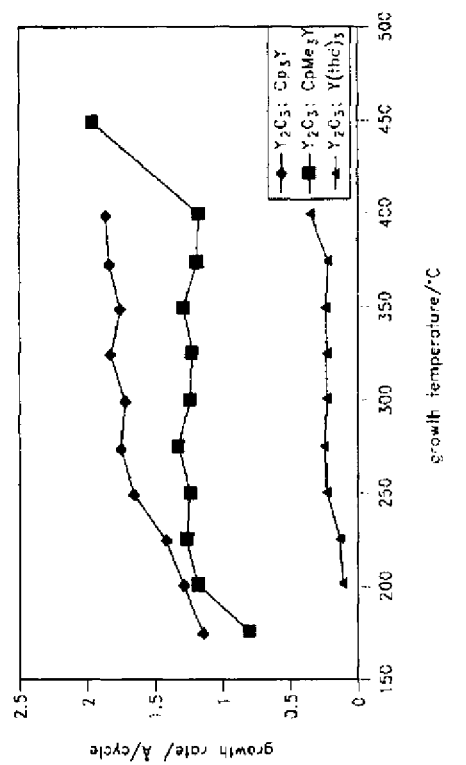
Figure 13:
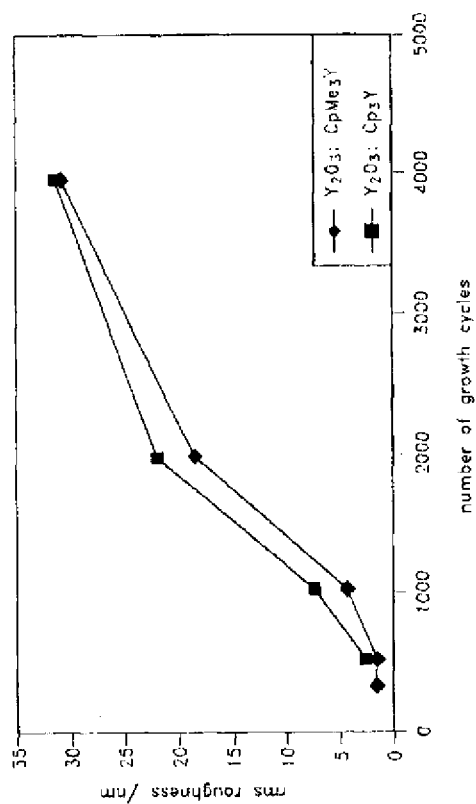

The refractive index of the films was 1.87-1.97 XRD measurements confirmed the cubic structure of $Gd_2O_3$ on all substrates. Films deposited on (100) GaAs showed strong preferred (111) orientation although very weak reflections of other orientations could be distinguished from the thicker films, as seen in FIG. 22. The FWHMs of the (222) and (444) rocking curves were about 0.05° and that of (440) larger than 0.20. For comparison, FWHM measured for the GaAs (100) reflection was 0.06°. All the rocking curves showed no orientation but on silicon the (440) reflection gave a FWHM of 0.21°.

XRD measurements showed very good crystal quality and strong orientation even of very thin (as thin as 15 nm) $Gd_2O_3$ on (100) GaAs.

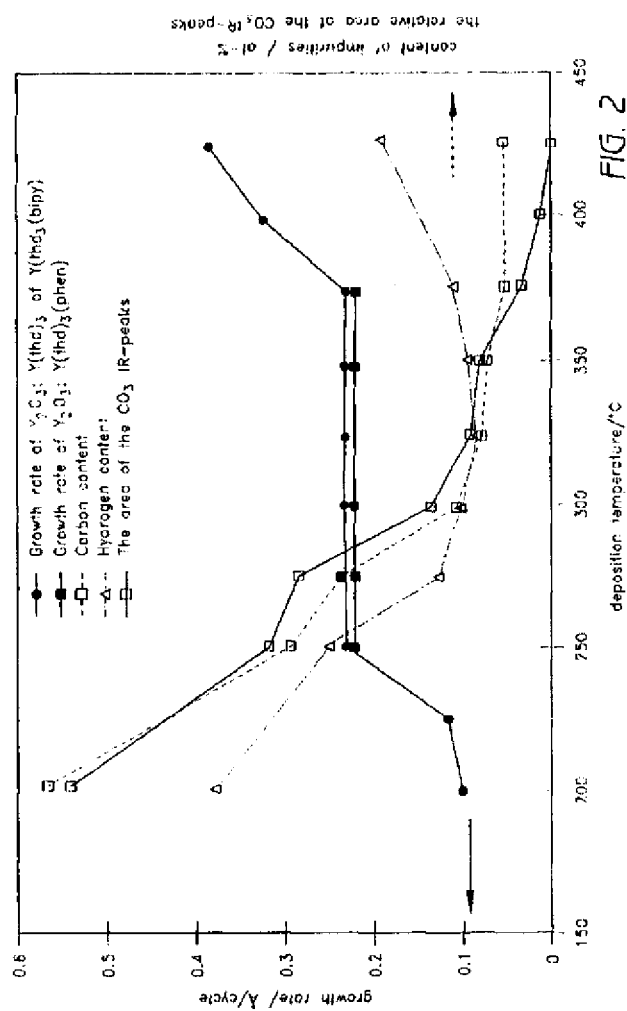

What is claimed is:

1. An atomic layer deposition (ALD) process for depositing rare earth metal oxide thin films on a substrate in a reaction space, comprising the steps of:
    a) feeding a vapor-phase pulse of a rare earth metal source chemical into the reaction space, said metal source chemical being selected from the group consisting of cyclopentadienyl compounds and cyclooctadienyl compounds of the rare earth metal;
    b) contacting the vapor-phase pulse of the rare earth metal source chemical with the surface of the substrate;
    c) purging the reaction space with the aid of an inert gas;
    d) feeding a vapor-phase pulse of an oxygen source chemical into the reaction space;
    e) purging the reaction space with the aid of an inert gas; and
    f) repeating steps a) through e) to deposit a thin film consisting essentially of rare earth metal oxide.

2. The process of claim 1, wherein the oxygen source chemical is selected from the group consisting of water, hydrogen peroxide, a mixture of water and hydrogen peroxide, a mixture of oxygen and ozone, and oxygen plasma products.

3. The process of claim 1, wherein the rare earth metal source chemical is fed into the reaction space with the aid of an inert carrier gas.

4. The process of claim 1, wherein the oxygen source chemical is fed into the reaction space with the aid of an inert carrier gas.

5. The process of claim 1, wherein the substrate is a compound semiconductor.

6. The process of claim 5, wherein the substrate is GaAs.

7. An atomic layer deposition (ALD) process for depositing a thin film on a substrate in a reaction space comprising:
    feeding a vapor-phase pulse of a metal source chemical into the reaction space;
    removing unreacted vapor-phase metal source chemical from the reaction space;
    feeding a vapor-phase pulse of an oxygen source chemical into the reaction space; and
    removing unreacted vapor-phase oxygen source chemical from the reaction space,
    wherein the metal source chemical is selected from the group consisting of tris(cyclopentadienyl)yttrium ($Cp_3Y$), tris(methylcyclopentadienyl)yttrium (($CpMe)_3Y$) and tris(methylcyclopentadienyl)lanthanum (($CpMe)_3La$),
    wherein the thin film consists essentially of a rare earth metal oxide.

8. The process of claim 7, wherein the oxygen source chemical is selected from the group consisting of water and a mixture of oxygen and ozone.

9. The process of claim 7, wherein the metal source chemical is ($CpMe)_3Y$.

10. The process of claim 9, wherein the temperature in the reaction space is between about 175° C. and about 450° C. and the pressure in the reaction chamber is between about 1 mbar and about 50 mbar.

11. The process of claim 10, wherein the temperature in the reaction space is between about 200° C. and about 400° C.

12. The process of claim 10, wherein the pressure in the reaction chamber is between about 1 mbar and about 2 mbar.

13. The process of claim 7, wherein the metal source chemical is $Cp_3Y$.

14. The process of claim 13, wherein the temperature in the reaction chamber is between about 175° C. and about 400° C., and the pressure in the reaction chamber is between about 1 mbar and about 50 mbar.

15. The process of claim 14, wherein the temperature in the reaction chamber is between about 250° C. and about 300° C.

16. The process of claim 14, wherein the pressure in the reaction chamber is between about 1 mbar and about 2 mbar.

17. The process of claim 7, wherein the temperature in the reaction chamber is from about 160° C. to about 165° C. and the pressure in the reaction chamber is between about 1 mbar and about 50 mbar.

18. The process of claim 17, wherein the pressure in the reaction chamber is between about 1 mbar and about 2 mbar.

19. The process of claim 7, wherein the substrate is selected from the group consisting of a silicon wafer and soda lime glass.

20. The process of claim 7, wherein the substrate is a compound semiconductor.

21. The process of claim 20, wherein the substrate is GaAs.

22. A method of growing a thin film on a substrate from vapor-phase reactants comprising alternately introducing vapor-phase pulses of at least one metal source chemical and at least one oxygen source chemical into a reaction space containing a substrate to deposit a thin film consisting essentially of rare earth metal oxide, wherein the metal source chemical is a cyclopentadienyl or cyclooctadienyl compound of a rare earth metal selected from the group consisting of Sc, La, Ce, Pr, Nd, Sm, Eu, Gd, Tb, Dy, Ho, Er, Tm, Yb and Lu.

23. The process of claim 14, wherein the substrate is selected from the group consisting of a silicon wafer and soda lime glass.

24. The process of claim 20, wherein the metal source chemical is tris(methylcyclopentadienyl)lanthanum (($CpMe$)$_3$La).

* * * * *

UNITED STATES PATENT AND TRADEMARK OFFICE
CERTIFICATE OF CORRECTION

| | | |
|---|---|---|
| PATENT NO. | : 7,498,272 B2 | |
| APPLICATION NO. | : 11/024515 | |
| DATED | : March 3, 2009 | |
| INVENTOR(S) | : Niinisto et al. | |

It is certified that error appears in the above-identified patent and that said Letters Patent is hereby corrected as shown below:

Title page 1 (item 75 inventors), line 3-4, please change "Berkeley Heights, NJ (US)" for Petri Räisänen and insert --Gilbert, AZ (US)--.

Title page 1 (item 56), col. 2, line 12, please delete "yitrium" and insert therefore, --yttrium--.

Title page 1 (item 56), col. 2, line 12, please delete "Dikelonate" and insert therefore, --Diketonate--.

Title page 1 (item 56), col. 2, line 15, after "deposition" please insert therefore, --of--.

Title page 1 (item 56), col. 2, line 16, please delete "Dikelonate" and insert therefore, --Diketonate--.

Title page 2 (item 56), col. 2, line 1, please delete "Dikelonate" and insert therefore, --Diketonate--.

In the drawings, Figs 2, 7, 8, 9, 10, 11 and 13 should be replaced with the corrected Figs 2, 7, 8, 9, 10, 11 and 13, as shown on the attached pages.

At col. 1, line 67, please delete "On" and insert therefore, --on--.

At col. 2, line 31-32, please delete "a(Si) 2" and insert therefore, --a(Si) · 2--.

At col. 2, line 32, please delete "M.-H." and insert therefore, --M. H.--.

At col. 3, line 61, please delete "Y(thd)$_3$." and insert therefore, --Y(thd)$_3$- --.

At col. 3, line 61, please delete "fenantroline" and insert therefore, --Phenanthroline--.

At col. 4, line 26 (approx.), please delete "0.8" and insert therefore, --0.8 s--.

At col. 5, line 42 (approx.), please delete "CO3" and insert therefore, --CO$_3$--.

At col. 6, line 25, please delete "hm" and insert therefore, --nm--.

At col. 6, line 56, please delete "(CpMe)$_6$La" and insert therefore, --(CpMe)$_3$La--.

At col. 6, line 66, please delete "Y$_2$o3" and insert therefore, --Y$_2$O$_3$--.

At col. 7, line 7, please delete "Gd2O3" and insert therefore, --Gd$_2$O$_3$--.

At col. 8, line 55, please delete "((CpMe$_3$Y)" and insert therefore, --(CpMe)$_3$Y--.

At col. 8, line 57, please delete "((CpMe$_3$ La)" and insert therefore, --(CpMe)$_3$ La--.

At col. 9, line 48, please delete "alkokside" and insert therefore, -- alkoxide--.

Signed and Sealed this
Twenty-ninth Day of May, 2012

David J. Kappos
*Director of the United States Patent and Trademark Office*

CERTIFICATE OF CORRECTION (continued)

U.S. Pat. No. 7,498,272 B2

At col. 10, line 37, please delete "tetrahydrofurane" and insert therefore, --tetrahydrofuran--.

At col. 12, line 5, please delete " $R_{rms}\sqrt{\dfrac{\sum_{i=1}^{n}(Z_i - Z_{ave})^2}{n}}$ "

and insert therefore, -- $R_{rms} = \sqrt{\dfrac{\sum_{i=1}^{n}(Z_i - Z_{ave})^2}{n}}$ --.

At col. 14, line 47 (approx ), please delete "tin" and insert therefore, --thin--.

At col. 14, line 52 (approx), please delete "an" and insert therefore, --a--.

At col. 15, line 65, please delete "tin" and insert therefore, --thin--.

At col. 17, line 2, please delete "tin" and insert therefore, --thin--.

At col. 17, line 62 (approx), please delete "X-dray" and insert therefore, --X-ray--.

At col. 19, line 36, please delete "0.20" and insert therefore, --0.2°--.